US012101968B2

United States Patent
Nakanishi

(10) Patent No.: US 12,101,968 B2
(45) Date of Patent: Sep. 24, 2024

(54) DISPLAY DEVICE

(71) Applicant: SHARP KABUSHIKI KAISHA, Sakai (JP)

(72) Inventor: Youhei Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 390 days.

(21) Appl. No.: 17/604,286

(22) PCT Filed: Apr. 16, 2019

(86) PCT No.: PCT/JP2019/016373
§ 371 (c)(1),
(2) Date: Oct. 15, 2021

(87) PCT Pub. No.: WO2020/213070
PCT Pub. Date: Oct. 22, 2020

(65) Prior Publication Data
US 2022/0199716 A1   Jun. 23, 2022

(51) Int. Cl.
| | |
|---|---|
| H10K 59/122 | (2023.01) |
| H10K 50/822 | (2023.01) |
| H10K 71/00 | (2023.01) |
| H10K 50/828 | (2023.01) |
| H10K 50/854 | (2023.01) |
| H10K 59/12 | (2023.01) |
| H10K 59/35 | (2023.01) |

(52) U.S. Cl.
CPC ......... *H10K 59/122* (2023.02); *H10K 50/822* (2023.02); *H10K 71/00* (2023.02); *H10K 50/828* (2023.02); *H10K 50/854* (2023.02); *H10K 59/1201* (2023.02); *H10K 59/35* (2023.02)

(58) Field of Classification Search
None
See application file for complete search history.

(56) References Cited

U.S. PATENT DOCUMENTS

| | | | |
|---|---|---|---|
| 2009/0284135 | A1 | 11/2009 | Yoshida et al. |
| 2017/0271612 | A1 | 9/2017 | Matsuzawa |
| | | (Continued) | |

FOREIGN PATENT DOCUMENTS

| | | |
|---|---|---|
| CN | 103700446 A | 4/2014 |
| JP | 2001-085163 A | 3/2001 |
| | (Continued) | |

OTHER PUBLICATIONS

Rongyue Liu et al., "Solution-processed composite electrodes composed of silver nanowires and aluminum-doped zinc oxide nanoparticles for thin-film solar cells applications", Solar Energy Materials and Solar Cells, 2018, pp. 584-592, vol. 174.

*Primary Examiner* — Michelle Mandala
(74) *Attorney, Agent, or Firm* — ScienBiziP, P.C.

(57) ABSTRACT

A display device includes a light-emitting element layer including a plurality of light-emitting elements including light-emitting elements configured to emit lights of luminescent colors different from each other, each light-emitting element being provided with a first electrode, a function layer including a light-emitting layer, and a second electrode in this order, the second electrode includes metal nanowires, and the light-emitting element layer is provided with a pixel bank segmenting the metal nanowires at least for each luminescent color.

19 Claims, 19 Drawing Sheets

(56) References Cited

U.S. PATENT DOCUMENTS

| | | | |
|---|---|---|---|
| 2017/0288162 | A1 | 10/2017 | Akiyama et al. |
| 2017/0373036 | A1 | 12/2017 | Yamazaki et al. |
| 2018/0012943 | A1 | 1/2018 | Ikeda et al. |
| 2019/0088899 | A1* | 3/2019 | Zhang .................... H10K 50/15 |
| 2019/0300738 | A1* | 10/2019 | Béalle ................. H10K 85/151 |

FOREIGN PATENT DOCUMENTS

| | | |
|---|---|---|
| JP | 2006-172886 A | 6/2006 |
| JP | 2009-187957 A | 8/2009 |
| JP | 2011-029037 A | 2/2011 |
| JP | 2011-060518 A | 3/2011 |
| JP | 2014-078014 A | 5/2014 |
| JP | 2017-168397 A | 9/2017 |
| JP | 2017-183510 A | 10/2017 |
| JP | 2018-010287 A | 1/2018 |
| JP | 2018-014320 A | 1/2018 |

* cited by examiner

DISPLAY DEVICE

TECHNICAL FIELD

The disclosure relates to a display device.

BACKGROUND ART

As known, in a display device having a top-emission self-light-emitting element, a semi-light-transmitting metal thin film of a magnesium silver alloy or the like (see PTL 1, for example) or a light-transmitting metal oxide thin film of ITO (indium tin oxide) or the like (see PTL 2, for example) is used for a second electrode that is an upper electrode provided above a light-emitting layer.

On the other hand, a transparent conductive film using metal nanowires is known as a transparent conductive film (see PTL 3, for example).

CITATION LIST

Patent Literature

PTL 1: JP 2017-183510 A
PTL 2: JP 2014-78014 A
PTL 3: JP 2011-29037 A

SUMMARY

Technical Problem

However, in a case that a semi-light-transmitting metal thin film of a magnesium silver alloy or the like is used for the second electrode described above, an optical transmittance is low and part of light is reflected to generate a cavity effect, which may disadvantageously deteriorate visual characteristics. On the other hand, in a case that a light-transmitting metal oxide thin film of ITO or the like is used for the second electrode, for example, a light-emitting layer or the like is damaged in sputtering film forming, which may disadvantageously degrade light-emission characteristics.

As such, it is conceivable to use a transparent conductive film using metal nanowires for the second electrode. The second electrode is generally provided in common to respective pixels as described in PTL 1. However, as a result of diligent study by the inventors of the present application, the inventors of the present application discovered that in the case that metal nanowires are used for the second electrode, light emitted from the light-emitting layer may be scattered by the metal nanowires to cause a color mixture.

One aspect of the disclosure has been made in view of the problems described above, and an object of the disclosure is to achieve a display device that can prevent the light-emission characteristics from degrading, improve visual angle characteristics, and prevent the color mixture due to the scattering by the metal nanowires.

Solution to Problem

A display device according to an embodiment of the disclosure is a display device provided with a plurality of pixels, the display device including a thin film transistor layer, and a light-emitting element layer including a plurality of light-emitting elements on the thin film transistor layer, the plurality of light-emitting elements including light-emitting elements configured to emit lights of luminescent colors different from each other, each light-emitting element being provided with a first electrode, a function layer including a light-emitting layer, and a second electrode in this order from a side of the thin film transistor layer, wherein the second electrode includes metal nanowires, and the light-emitting element layer is provided with a bank segmenting the metal nanowires at least for each luminescent color.

Advantageous Effects of Disclosure

According to an aspect of the disclosure, it is possible to realize a display device that can prevent the light-emission characteristics from degrading, improve the visual angle characteristics, and prevent the color mixture due to the scattering by the metal nanowires.

DESCRIPTION OF EMBODIMENTS

First Embodiment

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
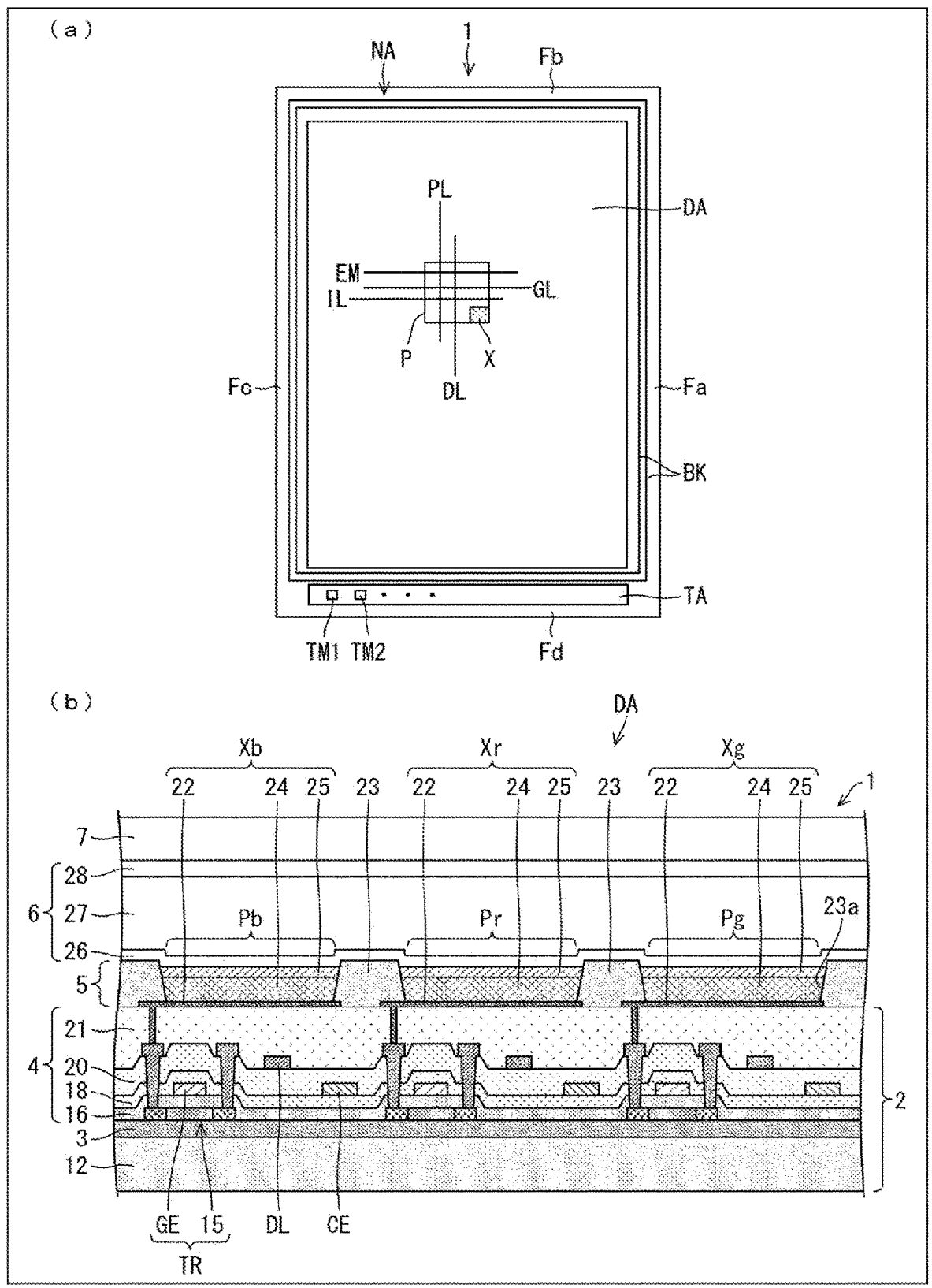
FIG. 1(a) is a plan view schematically illustrating a schematic configuration of a display device according to a first embodiment.
FIG. 1(b) is a cross-sectional view illustrating a schematic configuration of main portions of the display device according to the first embodiment.
Figure 2:
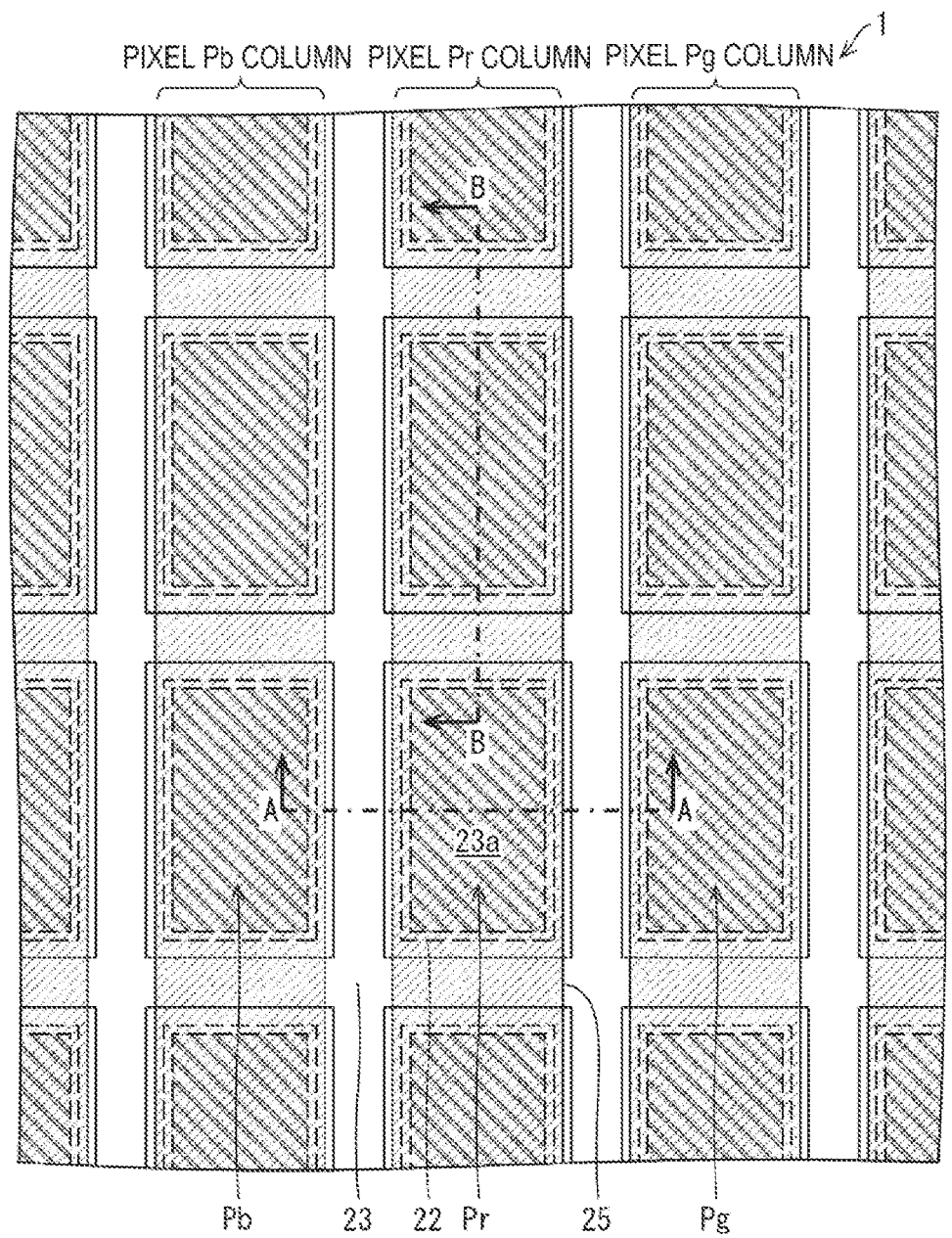
FIG. 2 is a plan view illustrating the schematic configuration of the main portions of the display device according to the first embodiment.

Schematic Configuration of Display Device (a) of FIG. 1 is a plan view schematically illustrating a schematic configuration of a display device 1 according to the present embodiment, and (b) of FIG. 1 is a cross-sectional view illustrating a schematic configuration of main portions of the display device 1 according to the present embodiment. FIG. 2 is a plan view illustrating the schematic configuration of the main portions of the display device 1 according to the present embodiment. Note that, in FIG. 2, for convenience of illustration, a sealing layer 6 and a function film 7 illustrated in (b) of FIG. 1 are omitted. In FIG. 2, for convenience of illustration, each of pixels Pr, Pg, and Pb has a rectangular shape, but each of four corners of each of the pixels Pr, Pg, and Pb has not a right angle but a curved shape, so-called round (circular) shape (arc shape) as illustrated in (b) of FIG. 8 described later.

As illustrated in (b) of FIG. 1, the display device 1 according to the present embodiment is a self-luminous display device, and has a configuration in which a light-emitting element layer 5 is provided on a support body 2. The light-emitting element layer 5 is sealed by the sealing layer 6. The function film 7 is bonded onto the sealing layer 6. The support body 2 is, for example, a thin film transistor (TFT) substrate, and includes a base material 12, a barrier layer 3 (base coat layer), and a thin film transistor layer 4 as a drive element layer in this order from a lower layer side. Thus, in the display device 1, the barrier layer 3, the thin film transistor layer 4, the light-emitting element layer 5, the sealing layer 6, and the function film 7 are provided on the base material 12 in this order. A plurality of pixels P having different display colors are formed in a display region DA of the display device 1. In the present embodiment, a red (R) color pixel Pr, a green (G) color pixel Pg, and a blue (B) color pixel Pb are formed as the pixels P. In the present embodiment, one picture element is constituted by three RGB pixels Pr, Pg, and Pb. Note that in the present embodiment, in a case that these pixels Pr, Pg, and Pb do not need to be distinguished, these pixels Pr, Pg, and Pb are collectively referred to simply as the pixel P.

As illustrated in (a) of FIG. 1, a frame region NA surrounding the display region DA includes four side edges Fa to Fd, and a terminal portion TA for mounting an electronic circuit board (IC chip, FPC, or the like) is formed on a part of the frame region NA (for example, the side edge Fd). The terminal portion TA includes a plurality of terminals TM. Driver circuits (not illustrated) may be formed on each of the side edges Fa to Fd.

The base material 12 may be a glass substrate or a flexible substrate including a resin film such as polyimide. The flexible substrate can also be formed of two layers of resin films and an inorganic insulating film sandwiched between these two layers. A film of PET (polyethylene terephthalate) or the like may be bonded to a lower face of the base material 12. A flexible display device having flexibility can also be formed as the display device 1 using a flexible substrate for the base material 12.

The barrier layer 3 is a layer that inhibits foreign matters such as water and oxygen from penetrating the thin film transistor layer 4 and the light-emitting element layer 5, and can be formed, for example, of a silicon oxide film, a silicon nitride film, or a silicon oxynitride film, or of a layered film of these, formed by chemical vapor deposition (CVD).

As illustrated in (b) of FIG. 1, the thin film transistor layer 4 includes a semiconductor layer including a semiconductor film 15, an inorganic insulating film 16 (gate insulating film), a first metal layer including a gate electrode GE, an inorganic insulating film 18, a second metal layer including a capacitance electrode CE, an inorganic insulating film 20, a third metal layer including a data signal line DL, and a flattening film 21 (interlayer insulating film). These layers are provided on the barrier layer 3 in this order from the barrier layer 3 side (or lower layer side).

The semiconductor layer is formed of, for example, amorphous silicon, LTPS (low-temperature polysilicon), or an oxide semiconductor, and a thin film transistor (TFT) TR is configured to include the gate electrode GE and the semiconductor film 15. A plurality of thin film transistors TR are provided in the thin film transistor layer 4.

A light-emitting element X and a pixel circuit are provided for each pixel P in the display region DA. The pixel circuit and wiring line connected thereto are formed in the thin film transistor layer 4. Examples of the wiring line that is connected to the pixel circuit include a scanning signal line GL and a light emission control line EM formed in the first metal layer, an initialization power source line IL formed in the second metal layer, the data signal line DL and a high-voltage side power source line PL formed in the third metal layer, and the like. The pixel circuit includes a drive transistor that controls a current of the light-emitting element X, a write transistor that electrically connects to the scanning signal line GL, a light emission control transistor that electrically connects to the light emission control line EM, and the like, as the thin film transistors TR.

The first metal layer, the second metal layer, and the third metal layer are each formed of a metal single layer film or layered film including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by CVD. The flattening film 21 can be formed of, for example, a coatable organic material such as polyimide or acrylic resin.

The light-emitting element layer 5 includes a first electrode 22, a pixel bank 23 (bank), a function layer 24 (active layer), and a second electrode 25. The first electrode 22 is patterned in an island shape for each pixel P on the flattening film 21 in the thin film transistor layer 4. The first electrode 22 is electrically connected to the thin film transistor TR as the drive transistor via a contact hole provided in the flattening film 21.

The pixel bank 23 is a lattice pattern pixel separation wall that defines a light-emitting region in each pixel P, and a portion of the first electrode 22 exposed by the pixel bank 23 (in other words, an opening 23a of the pixel bank 23 formed between lower edges of the pixel bank 23 in a plan view) is the light-emitting region in each pixel P. In the present embodiment, the pixel bank 23 is formed on the flattening film 21 and the first electrode 22 to cover a periphery (edge) of the first electrode 22. As a result, the pixel bank 23 according to the present embodiment functions as an edge cover for preventing a short circuit between the first electrode 22 and the second electrode 25 due to electrical field concentration at a pattern end portion of the first electrode 22. The pixel bank 23 is formed by applying an organic material such as a polyimide or an acrylic resin, and then, patterning the organic material by photolithography, for example.

In the light-emitting element layer 5, a plurality of light-emitting elements emitting lights of luminescent colors different from each other are provided as light-emitting elements X. Specifically, in the light-emitting element layer 5, a light-emitting element Xr emitting light of a luminescent color of red (R) color (red light-emitting element), a light-emitting element Xg emitting light of a luminescent color of green (G) color (green light-emitting element), and a light-emitting element Xb emitting light of a luminescent color of blue (B) color (blue light-emitting element) are formed. Note that in the present embodiment, in a case that these pixels Pr, Pg, and Pb do not need to be distinguished, these light-emitting elements Xr, Xg, and Xb are collectively referred to simply as the light-emitting element X. Each light-emitting element X includes the first electrode 22, the function layer 24 (active layer), and the second electrode 25. As illustrated in FIG. 2, the display device 1 according to the present embodiment includes a pixel arrangement in which pixels P having the same display color are arranged in a stripe, referred to as a stripe arrangement. The second electrode 25 is formed for each of a column of the pixels Pr, a column of the pixels Pg, and a column of the pixels Pb, which respectively have the identical luminescent color, in common to the pixels Pr, the pixels Pg, and the pixels Pb, respectively. The second electrode 25 is in contact with (electrically connected to) a conductive film (not illustrated) formed of the same material as the first electrode 22 and in the same layer as the first electrode 22, in a trench (not illustrated) provided on the flattening film 21 in the frame region NA. Details of the light-emitting element X will be described below.

The sealing layer 6 is light-transmitting and, as illustrated in (b) of FIG. 1, includes an inorganic sealing film 26, an organic sealing film 27, and an inorganic sealing film 28 in order from the lower layer side (light-emitting element layer 5 side), for example. However, the sealing layer 6 is not limited thereto, and the sealing layer 6 may be formed of a single layer of an inorganic sealing film or a layered body of five or more layers of an organic sealing film and an inorganic sealing film. The sealing layer 6 covering the light-emitting element layer 5 inhibits foreign matters such as water and oxygen from penetrating the light-emitting element layer 5.

The organic sealing film 27 has a flattening effect and is light-transmitting, and can be formed from coatable organic materials by ink-jet application, for example. The inorganic sealing films 26 and 28 are inorganic insulating films and can be formed of a silicon oxide film, a silicon nitride film, a silicon oxynitride film, or a layered film of these, formed by CVD, for example.

As illustrated in (a) of FIG. 1, a frame-shaped bank BK is provided outside the trench and surrounding the active area DA in the frame region NA. The frame-shaped bank BK defines an edge of the organic sealing film 27 by holding back a flow of a resin that is the material of the organic sealing film 27. The edge of the organic sealing film 27 overlaps a portion of the frame-shaped bank BK.

The frame-shaped bank BK is formed of the material the same as the pixel bank 23 on the thin film transistor layer 4 when forming the pixel bank 23, for example. In order to increase a height of the frame-shaped bank BK, when forming the flattening film 21, a lower layer bank may be formed, as a part of the frame-shaped bank BK, of the same material as the flattening film 21 and in the same layer as the flattening film 21 to surround the flattening film 21, and then, when forming the pixel bank 23, an upper layer bank may be formed of the same material as the pixel bank 23 and on the lower layer bank. Note that the frame-shaped banks BK may be formed in multiple frames (e.g., double frames as illustrated in (a) of FIG. 1).

Examples of the function film 7 include a film having at least one of an optical compensation function, a touch sensor function, and a protection function, for example.

Figure 3:
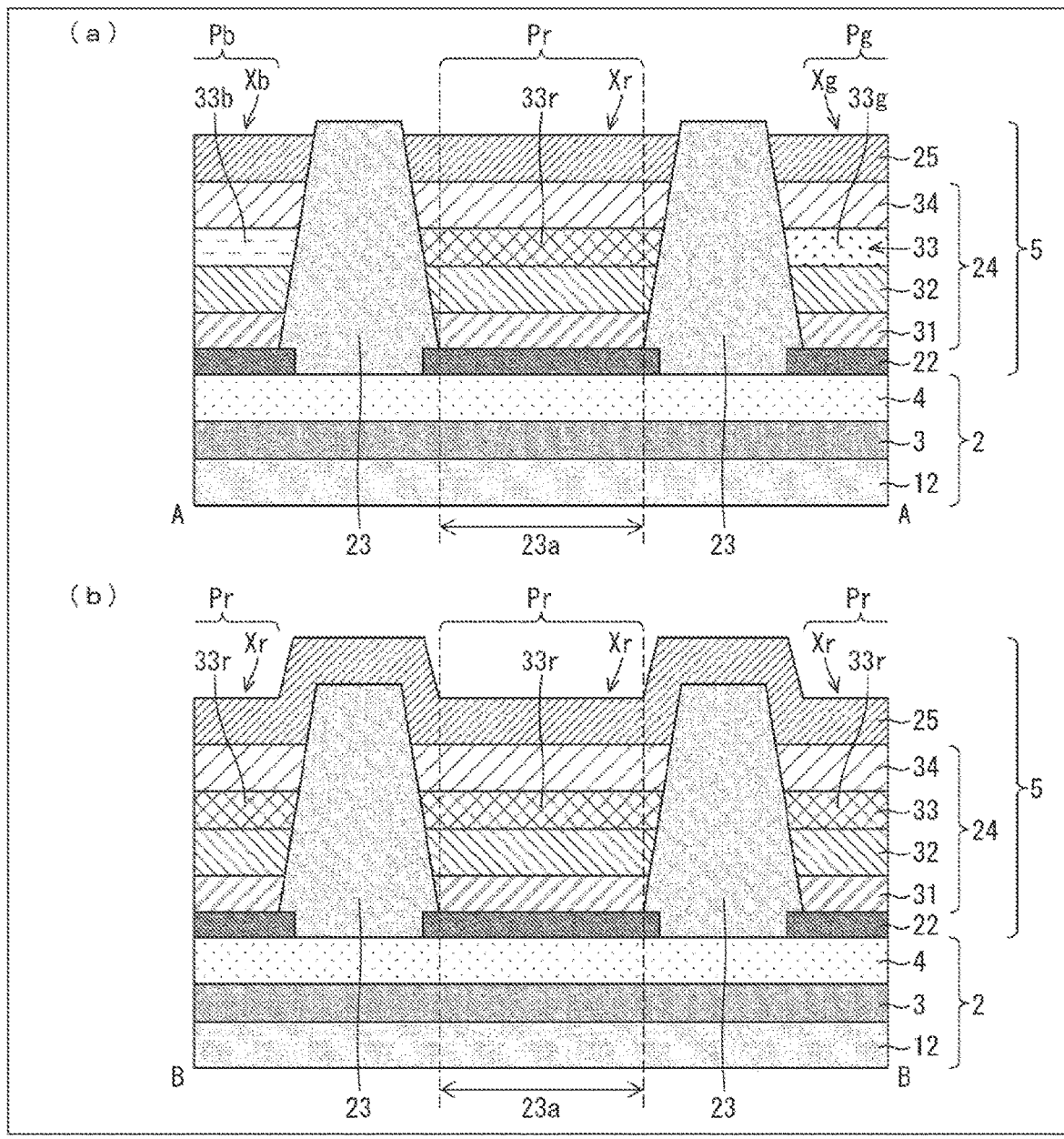
FIG. 3(a) is a diagram schematically illustrating a cross section of the display device illustrated in FIG. 2 viewed in a direction of arrows taken along a line A-A.
FIG. 3(b) is a diagram schematically illustrating a cross section of the display device illustrated in FIG. 2 in a direction of arrows taken along a line B-B.

Schematic Configuration of Light-Emitting Element X (a) of FIG. 3 is a diagram schematically illustrating a cross section of the display device 1 illustrated in FIG. 2 viewed in a direction of arrows taken along a line A-A, and (b) of FIG. 3 is a diagram schematically illustrating a cross section of the display device 1 illustrated in FIG. 2 in a direction of arrows taken along a line B-B. Note that, in (a) and (b) of FIG. 3, for convenience of illustration, ratios of layer thicknesses of the layers are changed for illustration, the sealing layer 6 and the function film 7 illustrated in (b) of FIG. 1 are omitted, and the constituent elements in the thin film transistor layer 4 are omitted. Moreover, (a) and (b) of FIG. 3 illustrate a non-light-emission state (power off state).

As illustrated in (a) and (b) of FIG. 3, the function layer 24 in the light-emitting element X according to the present embodiment includes a hole injection layer 31, a hole transport layer 32, a light-emitting layer 33, and an electron injection layer 34, for example. The light-emitting element X is formed by, for example, layering the hole injection layer 31, the hole transport layer 32, the light-emitting layer 33, and the electron injection layer 34 on the first electrode 22 in this order from the first electrode 22 side (that is, the lower layer side). The function layer 24 including these layers is formed into an island shape in an opening 23a of the pixel bank 23 by vapor deposition, ink-jet method or photolithography method.

Note that (a) and (b) of FIG. 3 illustrate, as an example, a case that the first electrode 22 is an anode electrode, the second electrode 25 is a cathode electrode, and the anode electrode (first electrode 22), the function layer 24, and the cathode electrode (second electrode 25) are provided in this order from the thin film transistor layer 4 side. However, the light-emitting element X is not limited to the configuration described above, and may be provided with the cathode electrode, the function layer 24, and the anode electrode in this order from the thin film transistor layer 4 side. In this case, the function layer 24 is formed by layering the electron injection layer 34, the light-emitting layer 33, the hole transport layer 32, and the hole injection layer 31 in this order from the lower layer side. The function layer 24 including these layers is formed into an island shape for each opening 23a of the pixel bank 23 (in other words, for each pixel P) by vapor deposition, ink-jet method or photolithography method, for example.

Each of the light-emitting elements X may be, for example, a quantum dot light-emitting diode (QLED) that is a self-light-emitting element including a quantum dot layer as a light-emitting layer 33, or an organic light-emitting diode (OLED) that is a self-light-emitting element including an organic layer as the light-emitting layer 33.

A light-emitting layer 33r emitting light of a luminescent color of red is formed as the light-emitting layer 33 in the light-emitting element Xr serving as the red light-emitting element. A light-emitting layer 33g emitting light of a luminescent color of green is formed as the light-emitting layer 33 in the light-emitting element Xg serving as the green light-emitting element. A light-emitting layer 33b emitting light of a luminescent color of blue is formed as the light-emitting layer 33 in the light-emitting element Xb serving as the blue light-emitting element. In the present embodiment, in a case that these light-emitting layers 33r, 33g, and 33b do not need to be distinguished, these light-emitting layers 33r, 33g, and 33b are collectively referred to simply as the light-emitting layer 33.

Note that in (a) and (b) of FIG. 3, the same layers are hatched in the same manner. In the following figures, for example, the light-emitting layer 33r is diagonally cross-hatched in the same manner as the light-emitting layer 33r illustrated in (a) and (b) of FIG. 3, the light-emitting layer 33g is dotted-hatched in the same manner as the light-emitting layer 33g illustrated in (a) of FIG. 3, and the light-emitting layer 33b is dashed-hatched in the same manner as the light-emitting layer 33b illustrated in (a) of FIG. 3. Thus, the portions hatched in the same manner as the light-emitting layers 33r, 33g, and 33b illustrated in (a) and (b) of FIG. 3 emit lights of the same colors as the light-emitting layers 33r, 33g, and 33b illustrated in (a) and (b) of FIG. 3.

The pixel bank 23 basically has water repellency. Thus, in a case of forming the quantum dot layer of the QLED as the light-emitting layer 33, an island-shaped quantum dot layer corresponding to each pixel P can be formed by selectively applying a solution in which quantum dots are dispersed in a solvent by the ink-jet method, for example, in the opening 23a of the pixel bank 23. However, the pixel bank 23 need not necessarily have water repellency.

In a case of forming the organic layer of the OLED as the light-emitting layer 33 by vapor deposition, a fine metal mask (FMM) is used. The FMM is a sheet with a large number of openings (for example, made of Invar material), and an island-shaped organic layer corresponding to each pixel P is formed of an organic material passing through one of the openings.

A known hole transport material can be used for the hole injection layer 31. Preferably, the hole injection layer 31 may be made of at least one material selected from the group consisting of copper phthalocyanine (CuPc), [dipyrazino[2,3-F:2',3'-H]quinoxaline-2,3,6,7,10,11-hexacarbonitrile] (HAT-CN), poly(3,4-ethylenedioxythiophene) doped with poly(4-styrenesulfonate) (PEDOT:PSS), 4,4',4"-tris[(3-ethylphenyl) phenylamino] triphenylamine (m-TDATA), 4,4', 4"-tris [phenyl (m-tolyl)amino]triphenylamine (m-MT-DATA), molybdenum trioxide ($MoO_3$), tungsten oxide (WO), and the like, for example.

A known hole transport material can be used for the hole transport layer 32. Preferably, the hole transport layer 32 may be made of at least one material selected from the group consisting of poly[triphenylamine derivative] (p-TPD), N,N'-di(1-naphthyl)-N,N'-diphenylbenzidine (α-NPD), H-1 (tris(4-carbazoyl-9-ylphenyl)amine (TCTA), poly[(9,9-di-octylfluorenyl-2,7-diyl)-co-(4,4'-(N-(4-sec-butylphenyl))di-phenylamine)] (TFB), poly(N-vinylcarbazole) (PVK), 4,4'-bis(9-carbazolyl)-biphenyl (CBP), N,N'-diphenyl-N,N-bis (1-naphthyl)-1,1'-diphenyl-4,4'-diamine (NPB), N,N'-bis[4-di(m-tolyl)aminophenyl]-N,N'-diphenylbenzidine (DNTPD), and the like, for example.

The electron injection layer 34 according to the present embodiment serves as also an electron transport layer, and is provided as an electron injection and transport layer in contact with the light-emitting layer 33. A known electron transport material can be used for the electron injection layer 34. Preferably, the electron injection layer 34 may be made of at least one material selected from the group consisting of 2-(4'-t-butylphenyl)-5-(4"-biphenylyl)-1,3,4-oxadiazole (t-Bu-PBD), 1,3,5-tris(N-phenylbenzimidazole-2-yl) benzene (TPBi), zinc oxide (ZnO) nanoparticles, magnesium zinc oxide (MgZnO) nanoparticles, and the like, for example. In the case that the light-emitting element is a QLED, the electron injection layer 34 is often made of ZnO nanoparticles or MgZnO nanoparticles. However, the present embodiment is not limited to the above configuration, and an electron transport layer may be provided separately from the electron injection layer 34, as described in a modification example described later.

The first electrode 22 has light reflectivity and may include, for example, silver (Ag), an Ag alloy (an alloy including Ag), aluminum (Al), an Al alloy (an alloy including Al), a MgAg alloy (an alloy including magnesium (Mg) and Ag), a layered body of Ag and indium tin oxide (ITO), a layered body of an Ag alloy and ITO, a layered body of Al and indium zinc oxide (IZO), a layered body of an Al alloy and IZO, or the like. Note that ITO has a corrosion prevention function of Ag.

The second electrode 25 is configured to include metal nanowires NW (see (a) to (c) of FIG. 4, e.g., silver nanowires) and has a high optical transparency, as described below.

In the case that each light-emitting element X is an OLED, positive holes and electrons recombine inside the light-emitting layer 33 in response to a drive current between the first electrode 22 and the second electrode 25, and light is emitted when the excitons generated in this manner transition to a ground state. Because the second electrode 25 is highly light-transmitting and the first electrode 22 has light reflectivity, the light emitted from the light-emitting layer 33 is directed upward as top emission.

In the case that each light-emitting element X is a QLED, positive holes and electrons recombine inside the light-emitting layer 33 in response to a drive current between the first electrode 22 and the second electrode 25, and light (fluoresce) is emitted when the excitons generated in this manner transition from a conduction band to a valence band of the quantum dot.

A light-emitting element other than the OLED or the QLED (such as an inorganic light-emitting diode) may be formed in the light-emitting element layer 5.

Figure 4:
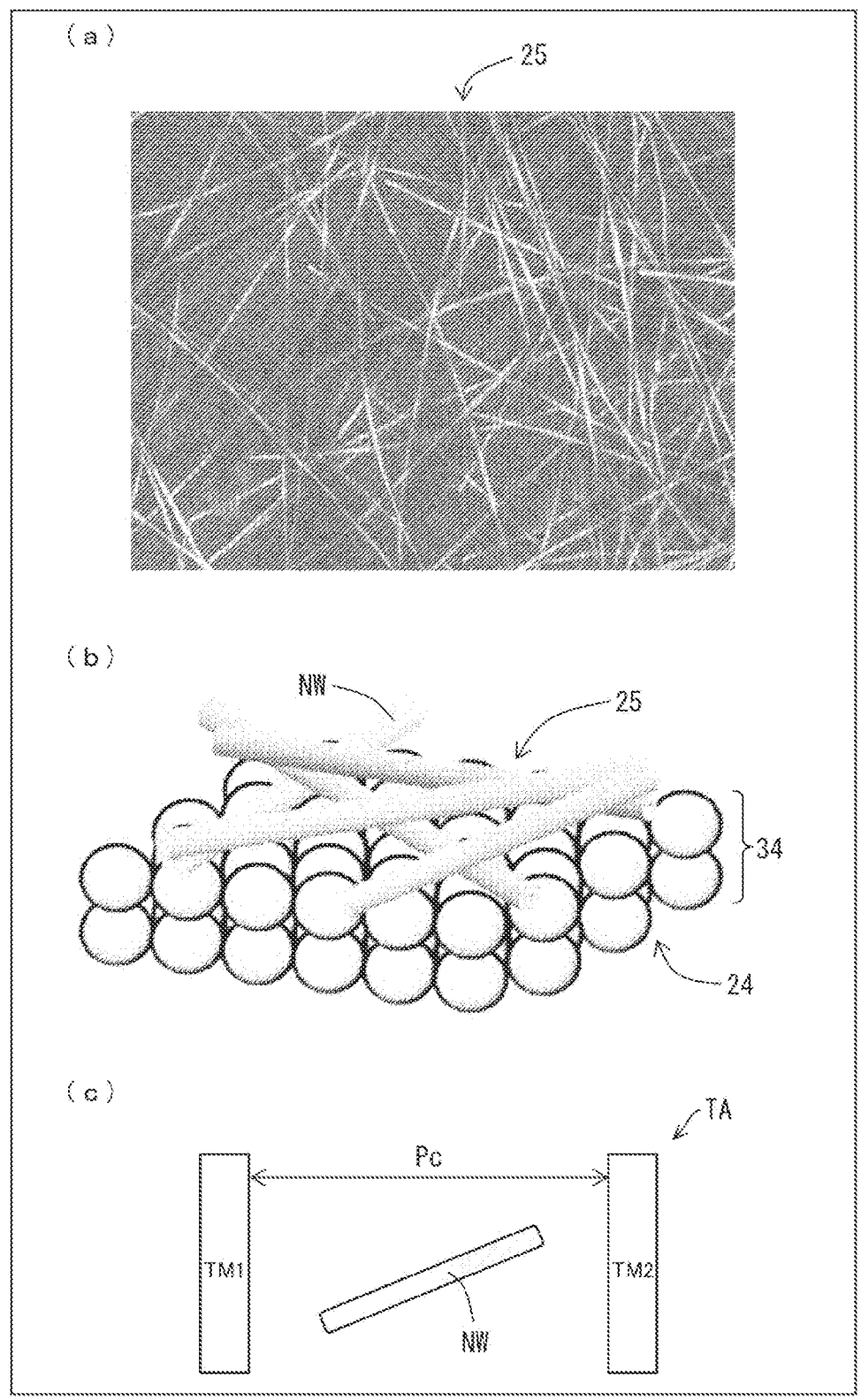
FIG. 4(a) is a diagram illustrating an SEM photograph of a second electrode according to the first embodiment.
FIG. 4(b) is a perspective view schematically illustrating a configuration of the second electrode according to the first embodiment.
FIG. 4(c) is an explanatory diagram schematically illustrating a length of a metal nanowire according to the first embodiment.

(a) of FIG. 4 is a diagram illustrating a scanning electron microscope (SEM) photograph of the second electrode 25, (b) of FIG. 4 is a perspective view schematically illustrating a configuration of the second electrode 25, and (c) of FIG. 4 is an explanatory diagram schematically illustrating a length of the metal nanowire NW.

In the present embodiment, the second electrode 25 that is an upper electrode is a metal nanowire layer and is formed of the mesh metal nanowires NW as illustrated in (a) and (b) of FIG. 4. The second electrode 25 is segmented for each luminescent color by the pixel bank 23. Thus, the metal nanowires NW are segmented for each luminescent color by the pixel bank 23.

The metal nanowire NW includes, for example, a nanowire containing at least one of silver (Ag), gold (Au), aluminum (Al), and copper (Cu). The metal nanowire NW may be a nanowire made of a single metal or may be a nanowire made of an alloy containing two or more metals of the metals described above.

Note that the number of overlapping layers of the metal nanowires NW in the second electrode 25 is from two to eight layers, and preferably from three to six layers. A diameter (Φ) of the metal nanowire NW is from 5 to 100 nm, preferably from 10 to 80 nm, and more preferably from 20 to 50 nm. The length (trace length) of the metal nanowire NW is from 1 to 100 μm, preferably from 5 to 50 μm, and more preferably from 8 to 30 μm. Note that these values can be obtained by observation using the SEM or the like. An electrical resistance (surface resistance) of the metal nanowire NW is from 5 to 200 Ω/Sq, preferably from 10 to 100 Ω/Sq, and more preferably from 10 to 50 Ω/Sq.

Furthermore, as illustrated in (c) of FIG. 4, the length (average trace length) of the metal nanowire NW is desirably smaller than a distance (terminal gap width) Pc between adjacent terminals TM1 and TM2 in the terminal portion TA. This can prevent a short circuit from occurring between the terminals TM1 and TM2 by the metal nanowires NW even when the metal nanowires NW are mixed into the terminal portion TA when the second electrode 25 is formed.

Method for Manufacturing Display Device 1

Figure 5:
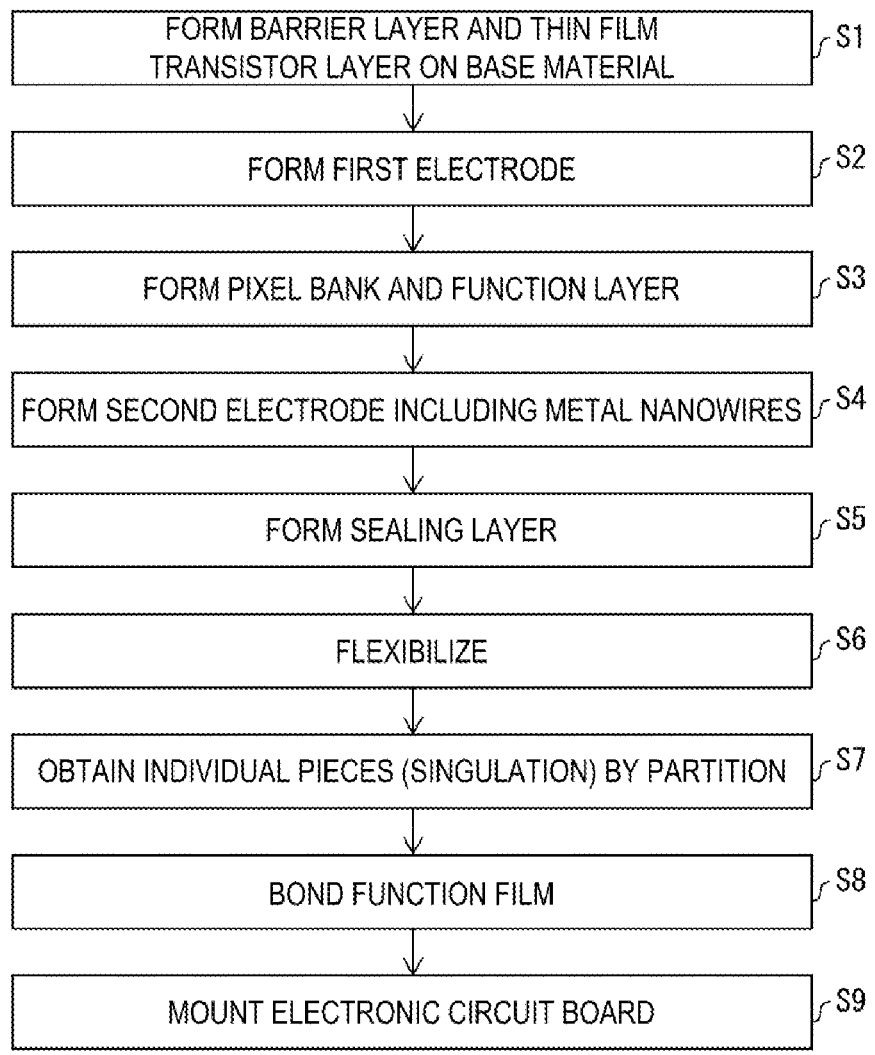
FIG. 5 is a flowchart illustrating a method for manufacturing the display device according to the first embodiment.

Next, a method for manufacturing the display device 1 described above will be described. FIG. 5 is a flowchart illustrating a method for manufacturing the display device 1 described above.

As illustrated in (b) of FIG. 1 and FIG. 5, in the present embodiment, first, the barrier layer 3 and the thin film transistor layer 4 are formed on the base material 12 (step S1). Next, the first electrode 22 is formed on the flattening film 21 in the thin film transistor layer 4 by sputtering method and photolithography method (step S2). Next, the pixel bank 23 and the function layer 24 are formed (step S3). In the present embodiment, in step S3, after the pixel bank 23 is formed to cover the edge of the patterned first electrode 22, the hole injection layer 31, the hole transport layer 32, the light-emitting layer 33, and the electron injection layer 34 are formed in this order from the first electrode 22 side in the opening 23a of the pixel bank 23.

Next, the second electrode 25 including the metal nanowires NW is formed on the function layer 24 (step S4). In step S4, a metal nanowire ink in which the metal nanowires NW are dispersed in a solvent is applied to the electron injection layer 34 so as to cross, for example, only the pixel banks 23 in the pixel columns having the identical luminescent color (that is, cross the pixel bank 23 between the pixels P having the identical luminescent color but not cross the pixel bank 23 between the pixels P having different luminescent colors) among the pixel banks 23, and thereafter, the applied metal nanowire ink is dried (the solvent is removed). As a result, the second electrode 25 formed of the mesh metal nanowires NW as illustrated in (a) to (c) of FIG. 4 is formed on the electron injection layer 34. This forms the light-emitting element layer 5 including the light-emitting elements X on the thin film transistor layer 4. The solvent (dispersion medium) may be, for example, water, ethanol, isopropanol, toluene, hexane, and the like. Note that the metal nanowire ink may include binder agents, dispersing agent, other additives, and the like. In the case that the second electrode 25 is formed by applying and drying the metal nanowire ink in this manner, compared to the case of by sputtering or a vapor deposition, there is a merit in that the effect on the light-emitting layer 33 (for example, the quantum dot light-emitting layer) is smaller. As a result, it is possible to prevent the light-emission characteristics of the display device 1 from degrading.

Furthermore, the second electrode 25 formed of the mesh metal nanowires NW is more flexible than a typical Ag thin film or the like, and is therefore, preferable as a common electrode for the flexible display device 1.

Next, after that, the sealing layer 6 is formed (step S5). Next, a flexibilization processing (step S6) is performed as necessary. In a case that a flexible display device is manufactured as the display device 1, in step S1, first, a mother glass is used as a light-transmitting support substrate, for example, and a resin layer is formed on the mother glass to prepare a base material as the base material 12 including the mother glass and the resin layer, and then, the barrier layer 3 and the thin film transistor layer 4 are formed on the resin layer. After that, after step S2 to step S5 are performed, in step S6, an upper face film (not illustrated) is bonded on the sealing layer 6. Next, the lower face of the resin layer is irradiated with laser light through the mother glass to reduce a bonding force between the mother glass and the resin layer, and the mother glass is peeled from the resin layer. After that, a lower face film not illustrated is bonded on the lower face of the resin layer. This forms a support body as the base material 12 in which a base material layer including the lower face film and the resin layer is formed instead of the mother glass.

Next, the layered body including these base material 12, barrier layer 3, thin film transistor layer 4, light-emitting element layer 5, and sealing layer 6 is partitioned to obtain a plurality of individual pieces (step S7). Next, the function film 7 is bonded to each of the obtained individual pieces (step S8). After that, an electronic circuit board (for example, an integrated circuits (IC) chip and a flexible printed circuits (FPC) board) is mounted on a portion (terminal portion TM) of the frame region NA outside the active area DA (step S9). This completes the display device 1.

Note that in a case that a solid (non-flexible) display device is manufactured as the display device 1, the resin layer forming and the base material 12 replacing are not necessary, and thus the process proceeds to step S7 after step S5. Furthermore, in the case that a solid display device is manufactured as the display device 1, a light-transmitting sealing member may be adhered using a sealing adhesive under a nitrogen atmosphere, instead of or in addition to forming the sealing layer 6 in step S5. The light-transmitting sealing member can be formed from glass, plastic, or the like, and preferably has a concave shape. Note that steps S1 to S9 are performed by a display device manufacturing apparatus (including a film formation apparatus configured to perform each process of the steps S1 to S5).

Effect

Next, an effect of the display device 1 according to the present embodiment will be described.

Figure 6:
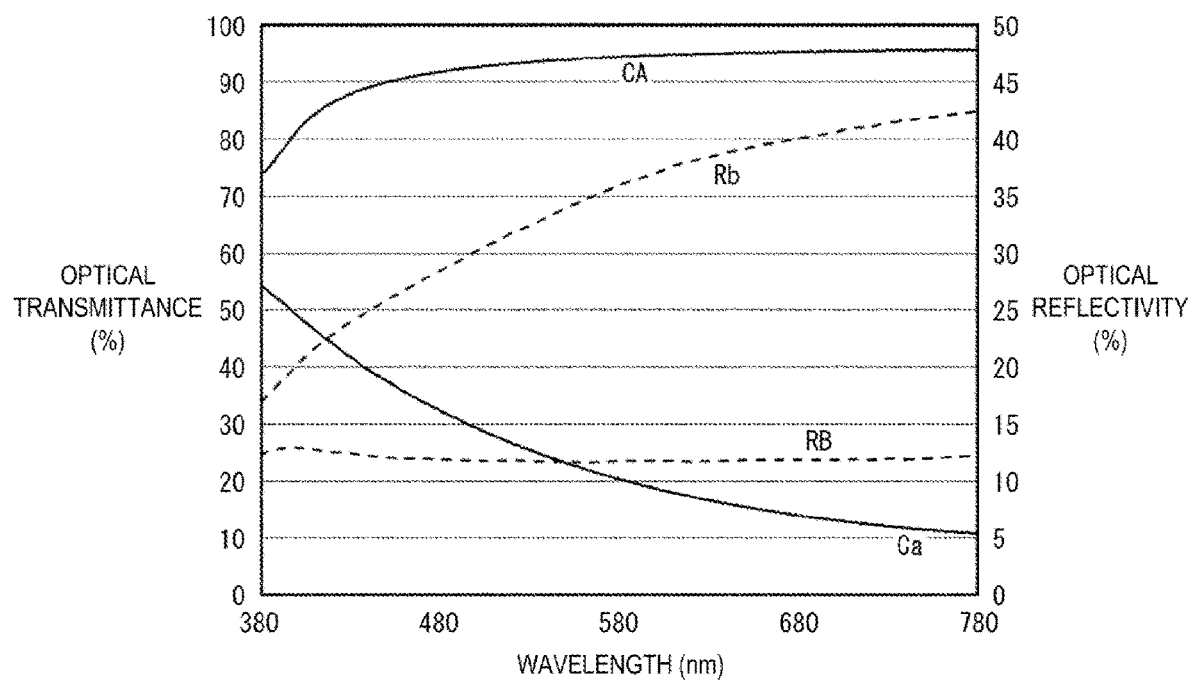
FIG. 6 is a graph illustrating an optical transmittance and an optical reflectivity of the second electrode when a mesh silver nanowire electrode is used for the second electrode, and an optical transmittance and an optical reflectivity of the second electrode when a silver thin film electrode is used for the second electrode.
Figure 7:
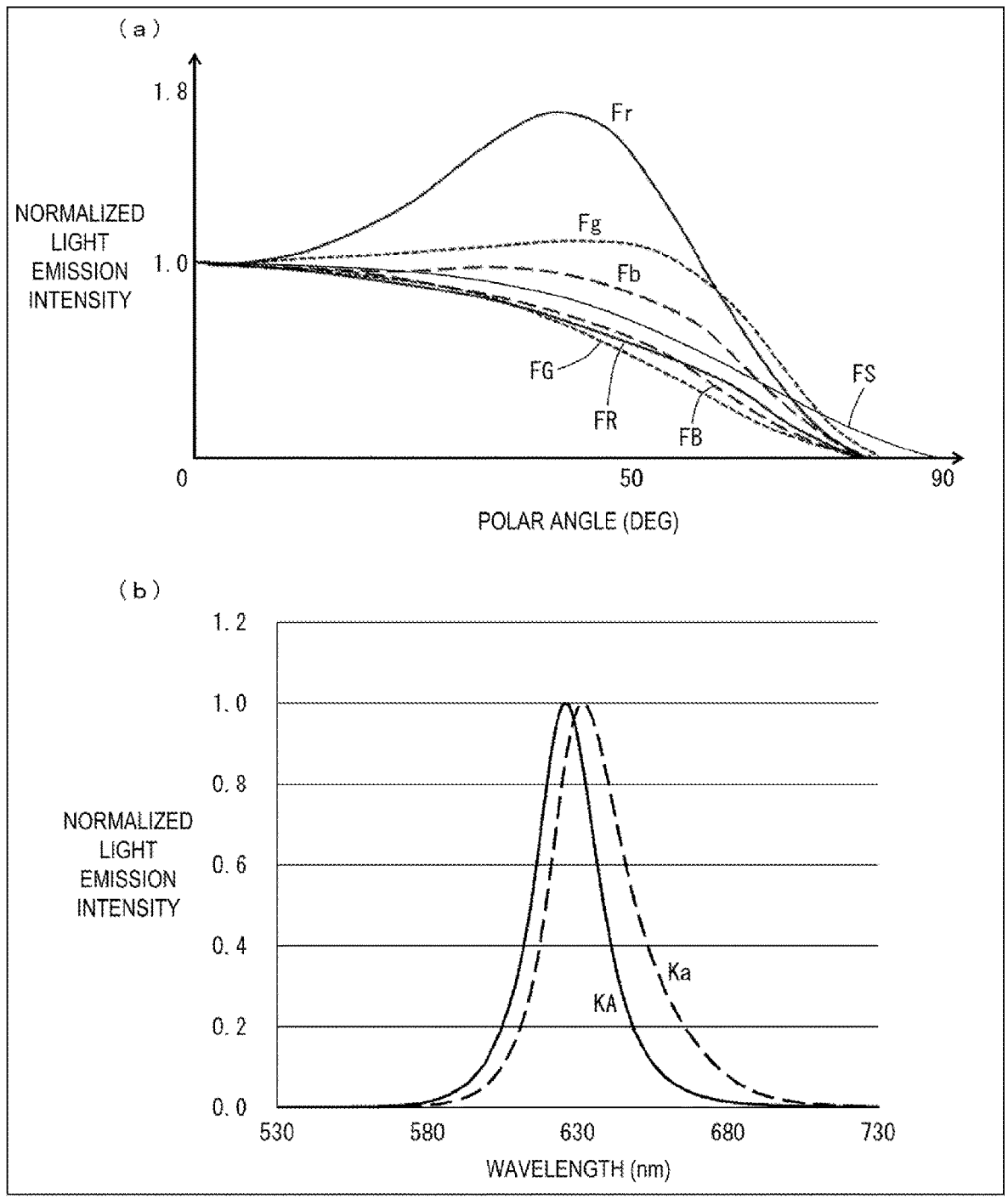
FIG. 7(a) is a graph illustrating characteristics of a normalized emission intensity normalized by a front light emission intensity with respect to a polar angle when a mesh silver nanowire electrode is used for the second electrode and characteristics of a normalized intensity with respect to a polar angle when a silver thin film electrode is used for the second electrode in a case that a light-emitting element is a QLED.
FIG. 7(b) is a graph illustrating emission wavelength characteristics normalized by a light emission intensity of an emission peak wavelength when a mesh silver nanowire electrode is used for the second electrode and emission wavelength characteristics normalized by a light emission intensity of an emission peak wavelength when a silver thin film electrode is used for the second electrode in a case that the light-emitting element is a QLED equipped with a quantum dot light-emitting layer for red light emission.

FIG. 6 is a graph illustrating an optical transmittance (CA) and an optical reflectivity (RB) of the second electrode 25 when a mesh silver nanowire electrode is used for the second electrode 25, and an optical transmittance (Ca) and an optical reflectivity (Rb) of the second electrode 25 when a silver thin film electrode is used for the second electrode 25. (a) of FIG. 7 is a graph illustrating characteristics of a normalized emission intensity (red color characteristic FR, green color characteristic FG, blue color characteristic FB) normalized by a front light emission intensity with respect to a polar angle when a mesh silver nanowire electrode is used for the second electrode 25 and characteristics of a normalized emission intensity (red color characteristic Fr, green color characteristic Fg, blue color characteristic Fb) normalized by a front light emission intensity with respect to a polar angle when a silver thin film electrode is used for the second electrode 25 in the case that the light-emitting element X is a QLED. (b) of FIG. 7 is a graph illustrating emission wavelength characteristics (red light-emission characteristic KA) normalized by a light emission intensity of an emission peak wavelength when a mesh silver nanowire electrode is used for the second electrode 25 and emission wavelength characteristics (red light-emission characteristic Ka) normalized by a light emission intensity of an emission peak wavelength when a silver thin film electrode is used for the second electrode 25 in a case that the light-emitting element X is a QLED equipped with a quantum dot light-emitting layer for red light emission (an emission peak wavelength of 620 nm, and a half width of 25 nm) as the light-emitting layer 33r.

Note that in FIG. 6 and (a) of FIG. 7, a thickness of each layer in the function layer 24 is common to the light-emitting elements Xr, Xg, and Xb.

It can be seen, from the results illustrated in FIG. 6, that in the case that the second electrode 25, which is the upper electrode, is a silver nanowire electrode, the optical transmittance (CA) of the second electrode 25 is higher than the optical transmittance (Ca) of the silver thin film electrode compared in a wavelength region from 380 to 780 nm and greater than 80% in the wavelength region from 400 nm to 780 nm. It can be seen also that in the case that the second electrode 25 being an upper electrode is a silver nanowire electrode, the optical reflectivity (RB) of the second electrode 25 is lower than the optical reflectivity (Rb) of the silver thin film electrode compared in the wavelength region from 380 to 780 nm and smaller than 15% in the wavelength region from 400 to 780 nm.

Thus, it can be seen from the above results that forming the second electrode 25 from the mesh metal nanowires NW as described above allows improvement in light extraction efficiency and good visual characteristics in the top-emitting configuration to be obtained.

In addition, it can be seen, from the results illustrated in (a) of FIG. 7, that all three of the red color characteristic FR, the green color characteristic FG, and the blue color characteristic FB in the case that the second electrode 25 is a silver nanowire electrode are closer to a Lambertian light distribution characteristic FS than all three of the red color character Fr, the green color characteristic Fg, and the blue color characteristic Fb in the case that the second electrode 25 is a silver thin film electrode. Note that the Lambertian light distribution characteristic FS indicates an ideal light distribution characteristic in which a radiation intensity in an angle θ direction is expressed as a cos θ of a radiation intensity on an optical axis, with a vertical front face being 0°.

Furthermore, it can be seen, from the results illustrated in (b) of FIG. 7, that the red light-emission characteristic Ka in the case that the second electrode 25 is a silver thin film electrode has the emission peak wavelength shifted toward a long wavelength side to exceed 630 nm and the half width of 32 nm because the cavity effect (resonant effect) between the first electrode 22 and the second electrode 25 adversely affects, whereas the red light-emission characteristic KA in the case that the second electrode 25 is a silver nanowire electrode has the emission peak wavelength of approximately 620 nm and the half width of approximately 25 nm, where the emission peak wavelength shift is smaller, the half width is narrower, and the cavity effect is more suppressed than the case that the second electrode 25 is a silver thin film electrode.

In this manner, in the case that a metal nanowire electrode having the high transmittance such as a silver nanowire electrode is used for the second electrode 25, there is almost no cavity effect. Thus, as described above, by adopting an electrode formed of metal nanowires to the second electrode 25 of the QLED where the cavity effect adversely affects, a larger effect (that is, an effect of improving the visual angle characteristics) can be obtained. In addition, as illustrated in (a) of FIG. 7, because there is almost no cavity effect in the case that a metal nanowire electrode having the high transmittance such as a silver nanowire electrode is used for the second electrode 25, the layer thicknesses of the respective layers between the first electrode 22 and the second electrode 25 (specifically, the layers in the function layer 24) can be closer to the Lambertian light distribution without being matched to the optimal value between the light-emitting elements Xr, Xg, and Xb, and thus, the layer thicknesses of these layers can be the same thickness. This allows the display device 1 excellent in the visual angle characteristics to be easily manufactured.

Figure 8:
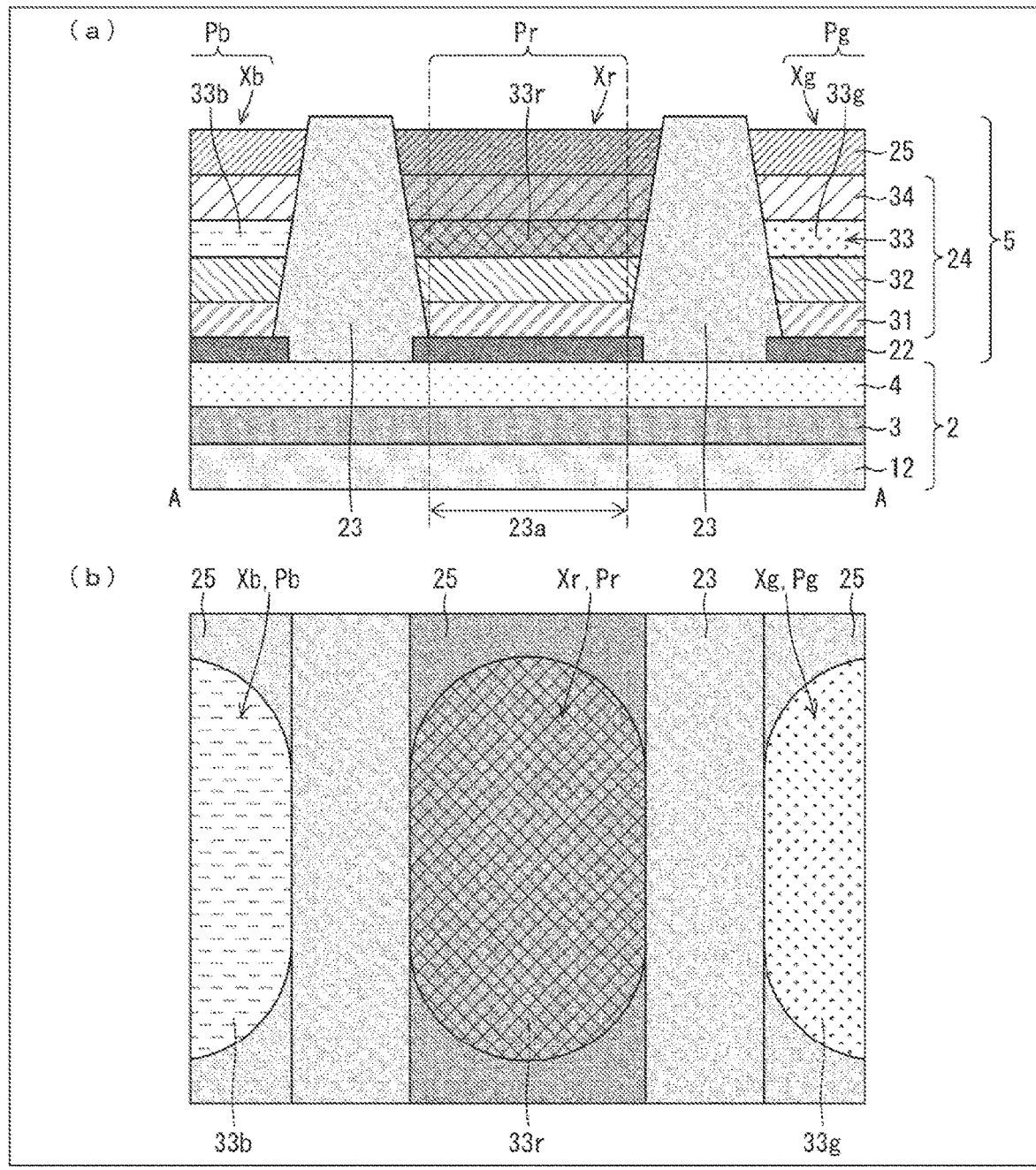
FIG. 8(a) is a cross-sectional view schematically illustrating a state in which only the light-emitting elements on columns of red pixels emit lights in the display device according to the first embodiment.
FIG. 8(b) is a plan view schematically illustrating a state in which only the light-emitting elements on the columns of the red pixels emit lights in the display device according to the first embodiment.
Figure 9:
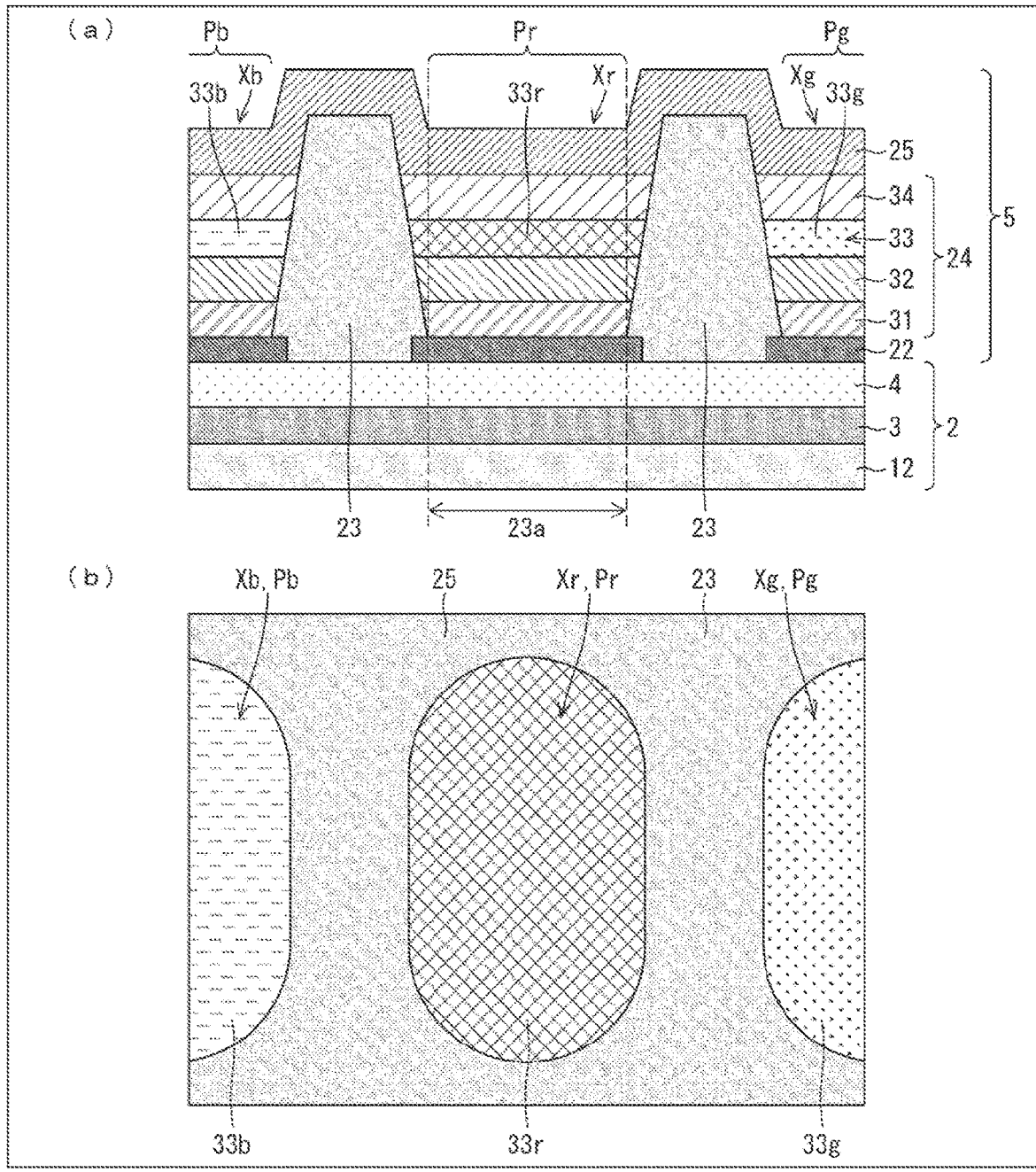
FIG. 9(a) is a cross-sectional view schematically illustrating a schematic configuration of main portions of a comparison display device.
FIG. 9(b) is a plan view schematically illustrating the schematic configuration of the main portions of the comparison display device.
Figure 10:
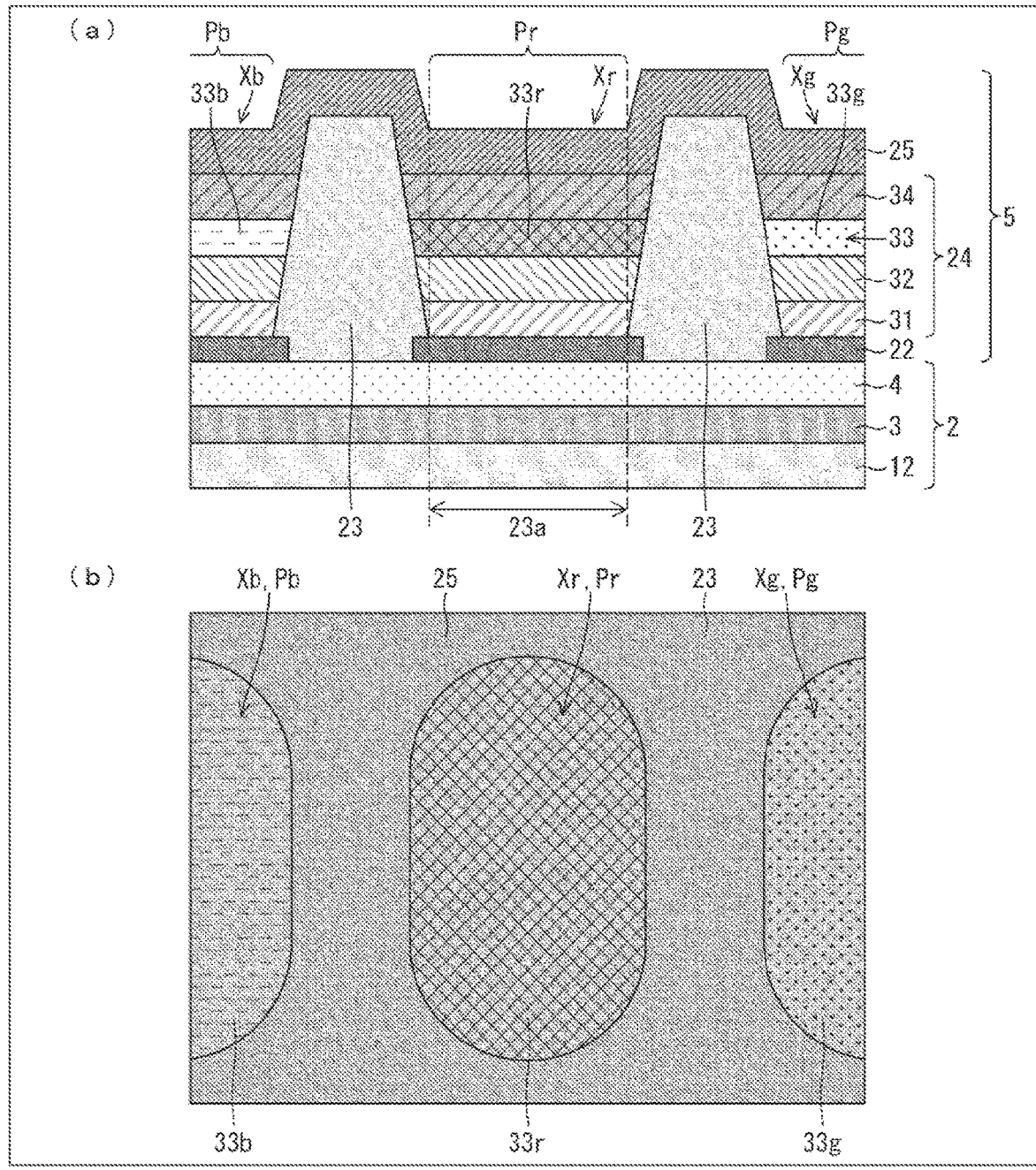
FIG. 10(a) is a cross-sectional view schematically illustrating a state in which only the light-emitting elements on columns of red pixels emit lights in the comparison display device illustrated in (a) and (b) of FIG. 9.
FIG. 10(b) is a plan view schematically illustrating a state in which only the light-emitting elements on the columns of the red pixels emit lights in the comparison display device illustrated in (a) and (b) of FIG. 9.

(a) of FIG. 8 is a cross-sectional view schematically illustrating a state in which only the light-emitting elements Xr on the columns of the red pixels Pr emit lights in the display device 1 according to the present embodiment, and (b) of FIG. 8 is a plan view schematically illustrating a state in which only the light-emitting elements Xr on the columns of the red pixels Pr emit lights in the display device 1 according to the present embodiment. (a) of FIG. 9 is a cross-sectional view schematically illustrating a schematic configuration of main portions of a comparison display device, and (b) of FIG. 9 is a plan view schematically illustrating the schematic configuration of the main portions of the comparison display device. Note that (a) and (b) of FIG. 9 illustrate a non-light emission state (power off state). (a) of FIG. 10 is a cross-sectional view schematically illustrating a state in which only the light-emitting elements Xr on columns of red pixels Pr emit lights in the comparison display device illustrated in (a) and (b) of FIG. 9, and (b) of FIG. 10 is a plan view schematically illustrating a state in which only the light-emitting elements Xr on the columns of the red pixels Pr emit lights in the comparison display device illustrated in (a) and (b) of FIG. 9. In other words, (a) and (b) of FIG. 8 and (a) and (b) of FIG. 10 schematically illustrate the state in which only the light-emitting layer 33r emits the light in each display device. Note that (a) of FIG. 9 and (a) of FIG. 10 illustrate a cross section corresponding to the cross section of the display device 1 illustrated in FIG. 2 viewed in the direction of arrows taken along a line A-A. In (a) of FIG. 8, (a) of FIG. 9, and (a) of FIG. 10, for convenience of illustration, ratios of the layer thicknesses of the layers are changed for illustration, and the constituent elements in the thin film transistor layer 4 are omitted. Furthermore, in (a) and (b) of FIG. 8 to (a) and (b) of FIG. 10, for convenience of illustration, the sealing layer 6 and the function film 7 illustrated in (b) of FIG. 1 are omitted.

The comparison display device illustrated in (a) and (b) of FIG. 9 has a configuration the same as the display device 1 according to the present embodiment except that the second electrode 25 is not patterned in the active area DA but formed on the pixel bank 23 to cover entirely the active area DA in a solid-like manner as a single electrode (common electrode) common to the all pixels P.

In the case that the second electrode 25 is formed of the mesh metal nanowires NW, the improvement in the light extraction efficiency and the good visual characteristics in the top-emitting configuration can be obtained as described above, while the light emitted from the light-emitting layer 33 is scattered by the metal nanowires NW and propagates through the second electrode 25.

Thus, as illustrated in (a) and (b) of FIG. 9, in the case that the second electrode 25 formed of the metal nanowires NW is formed on the pixel bank 23 to cover entirely the active area DA, the light emitted from the light-emitting layer 33r of the light-emitting element Xr is scattered by the metal nanowires NW, spreads across the second electrode 25, and is visible from the outside as illustrated in (a) and (b) of FIG. 10 in which portions of the function layer 24 and the second electrode 25 are hatched by a dark color indicating a red light, even in a case that only the red light-emitting element Xr emits light, for example. Thus, in the case that the metal nanowire NW is used for the cathode electrode (or the anode electrode in a case that the layering order is reversed) of the light-emitting element X of the top-emitting configuration, the light emitted from the light-emitting layer 33 may be scattered by the metal nanowires NW to cause the color mixture.

However, according to the display device 1 of the present embodiment, the second electrode 25, which is a metal nanowire layer, is partitioned by the pixel bank 23 for each luminescent color (that is, for each of the pixel columns having the identical luminescent color), and thereby, the light scattered by the metal nanowires NW can be prevented from propagating to the pixels P of other luminescent colors (pixels Pg and Pb in the example illustrated in (a) and (b) of FIG. 8) as illustrated in (a) and (b) of FIG. 8 in which portions of the function layer 24 and a portion of the second electrode 25 are hatched by a dark color indicating a red light.

Modification Example

Figure 11:
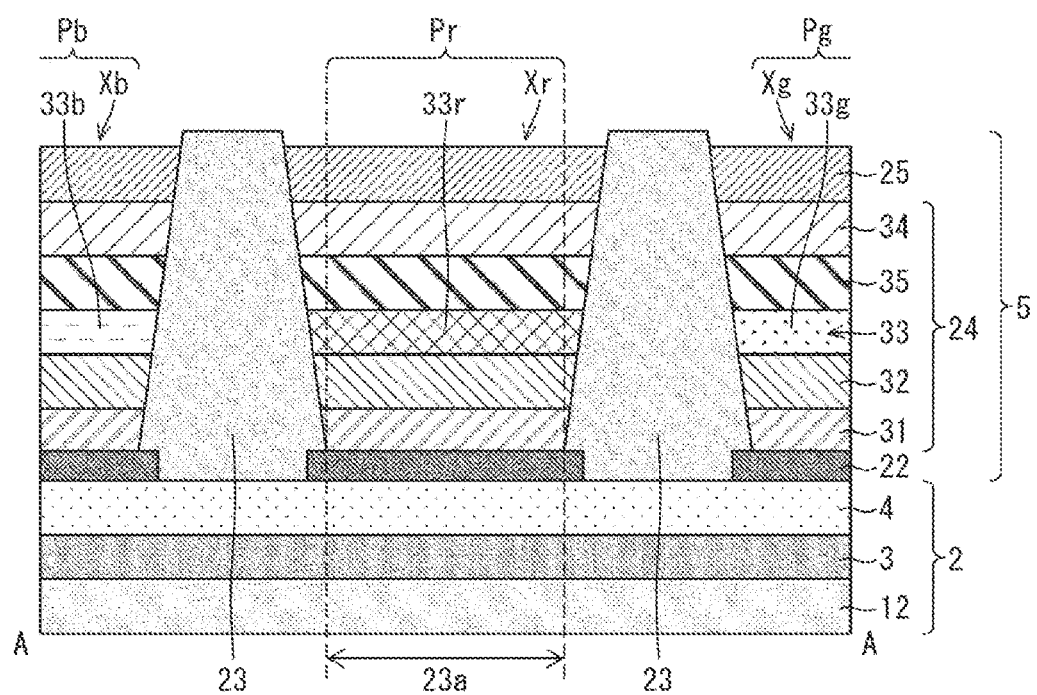
FIG. 11 is a cross-sectional view schematically illustrating a schematic configuration of main portions of a display device according to a modification example of the first embodiment.

FIG. 11 is a cross-sectional view schematically illustrating a schematic configuration of main portions of the display device 1 according to this modification example. Note that FIG. 11 corresponds to the cross-sectional view seen in a direction of arrows taken along a line A-A of the display device 1 illustrated in FIG. 2. In FIG. 11, for convenience of illustration, ratios of the layer thicknesses of the layers are changed for illustration, and the constituent elements in the thin film transistor layer 4 are omitted. Furthermore, in FIG. 11, for convenience of illustration, the sealing layer 6 and the function film 7 illustrated in (b) of FIG. 1 are omitted.

The display device 1 illustrated in FIG. 11 is the same as the display device 1 illustrated in (a) and (b) of FIG. 3 except that an electron transport layer 35 is provided separately from the electron injection layer 34. In other words, in the light-emitting element X in the display device 1 according to the present embodiment, the function layer 24 may further include the electron transport layer 35. As illustrated in FIG. 11, in the display device 1 according to this modification example, the hole injection layer 31, the hole transport layer 32, the light-emitting layer 33, the electron transport layer 35, and the electron injection layer 34 are layered in this order from the first electrode 22 side between the first electrode 22 and the second electrode 25.

In this case, an electron transport material similar to the material of the electron injection layer 34 described above can be used for the electron transport layer 35. Specifically, the electron transport layer 35 may be preferably made of at least one material selected from the group consisting of t-Bu-PBD, TPBi, 4,7-diphenyl-1,10-phenanthroline (Bphen), 2,9-dimethyl-4,7-diphenyl-1,10-phenanthroline (BCP), ZnO nanoparticles, MgZnO nanoparticles, and the like, for example. In the case that the light-emitting element is a QLED, the electron transport layer 35 is often made of ZnO nanoparticles or MgZnO nanoparticles.

On the other hand, the electron injection layer 34 can be preferably made of lithium fluoride (LiF), for example. In this case, as an example, the light-emitting element X has a layered structure of first electrode 22 (anode electrode)/hole injection layer 31/hole transport layer 32/light-emitting layer 33/ZnO nanoparticles (electron transport layer 35)/LiF (electron injection layer 34)/second electrode 25 (cathode electrode), or the like.

Note that the configuration of the function layer 24 is not limited to the configuration described above, and may be a configuration in which one or more layers of the hole injection layer 31, the hole transport layer 32, the electron transport layer 35, and the electron injection layer 34 is not formed. The function layer 24 may be provided with other function layers such as an electron blocking layer, a hole blocking layer, and the like.

Second Embodiment

In the present embodiment, differences between the present embodiment and the first embodiment will be described, and constituent elements having functions identical to the functions of the constituent elements in the first embodiment are denoted by identical reference signs, with description thereof being omitted.

Figure 12:
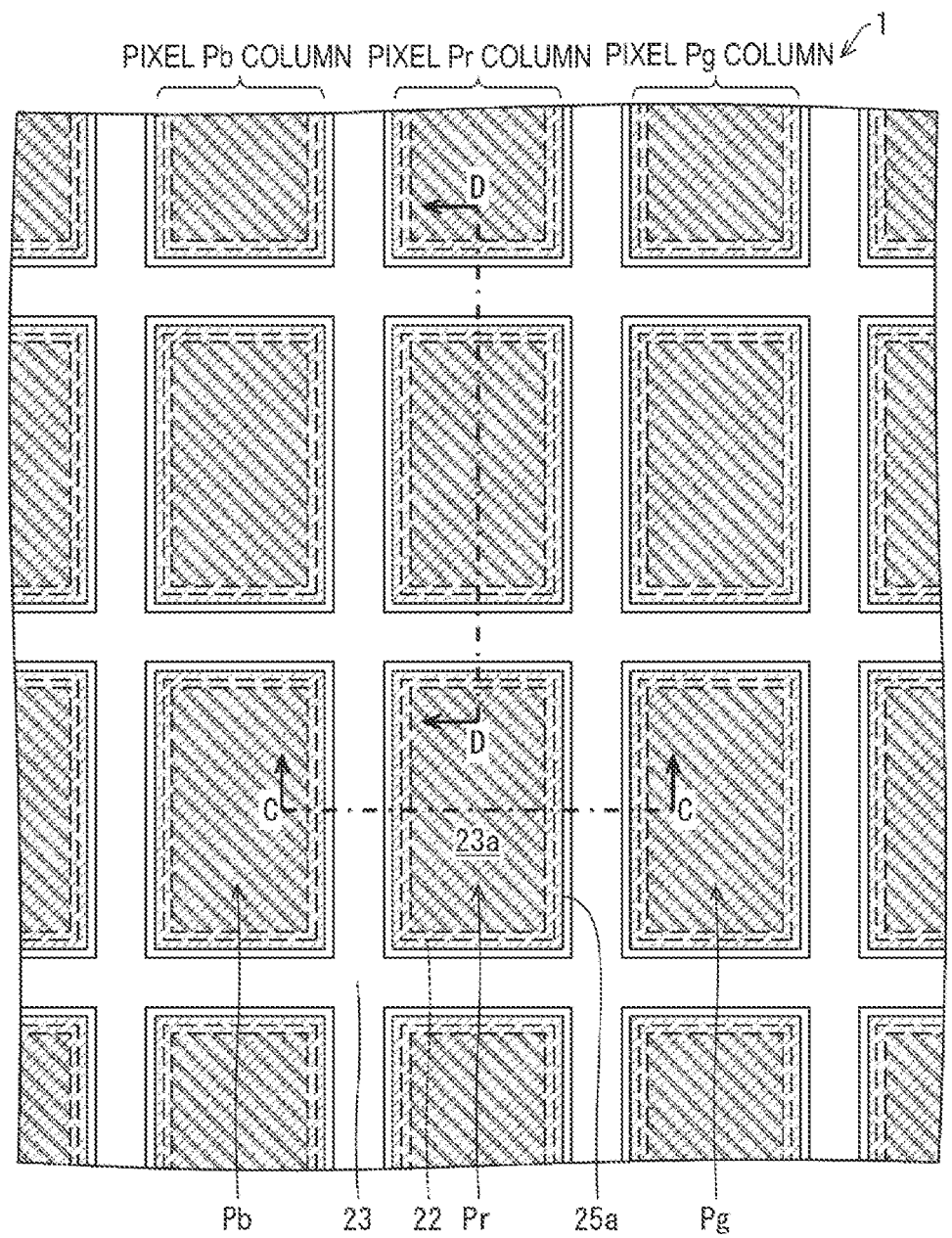
FIG. 12 is a plan view illustrating a schematic configuration of main portions of a display device according to a second embodiment.
Figure 13:
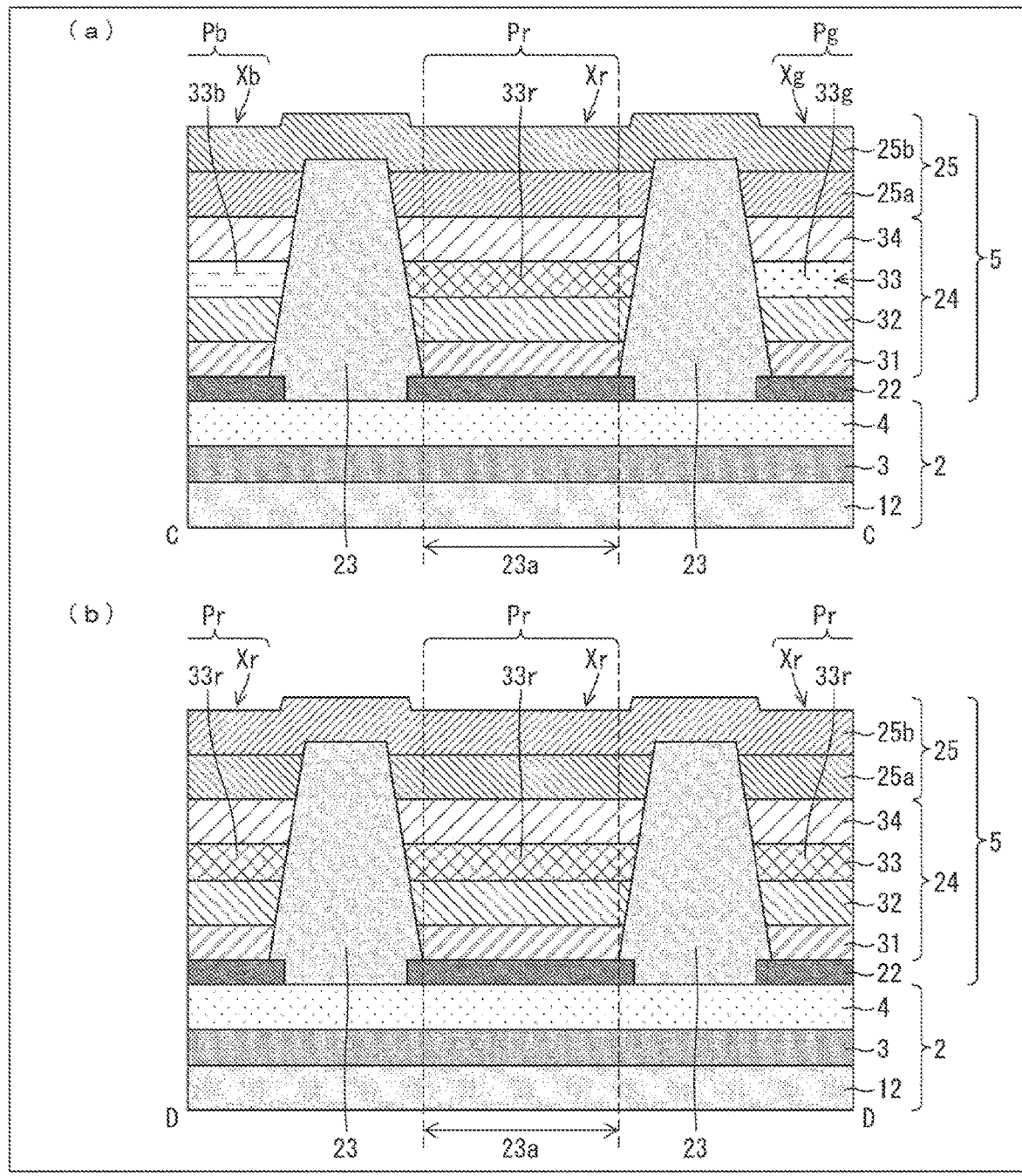
FIG. 13(a) is a diagram schematically illustrating a cross section of the display device illustrated in FIG. 12 viewed in a direction of arrows taken along a line C-C.
FIG. 13(b) is a diagram schematically illustrating a cross section of the display device illustrated in FIG. 12 in a direction of arrows taken along a line D-D.
Figure 14:
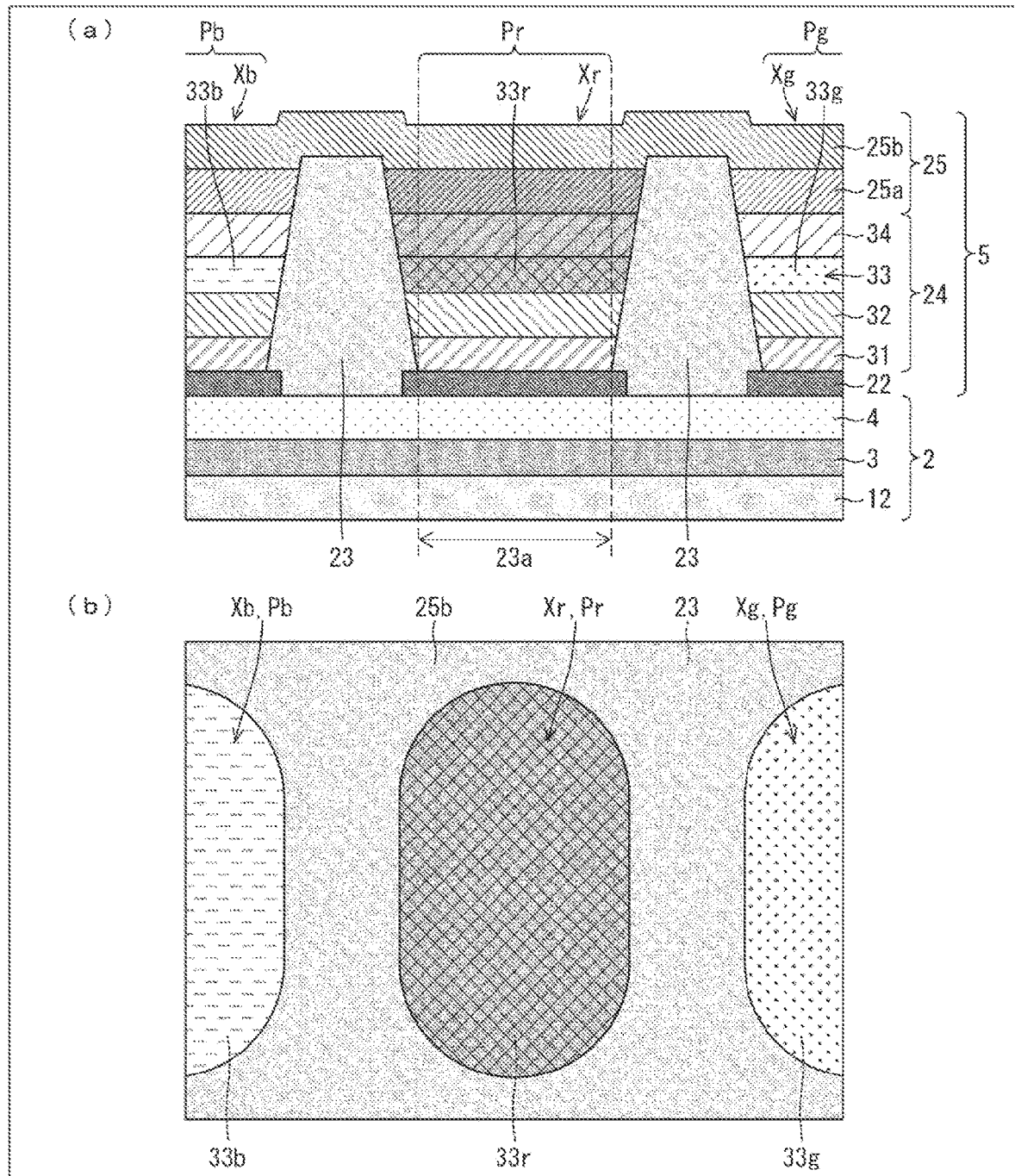
FIG. 14(a) is a cross-sectional view schematically illustrating a state in which only light-emitting elements on columns of red pixels emit lights in the display device according to the second embodiment.
FIG. 14(b) is a plan view schematically illustrating a state in which only the light-emitting elements on the columns of the red pixels emit lights in the display device according to the second embodiment.

FIG. 12 is a plan view illustrating a schematic configuration of main portions of the display device 1 according to the present embodiment. (a) of FIG. 13 is a diagram schematically illustrating a cross section of the display device 1 illustrated in FIG. 12 viewed in a direction of arrows taken along a line C-C, and (b) of FIG. 13 is a diagram schematically illustrating a cross section of the display device 1 illustrated in FIG. 12 in a direction of arrows taken along a line D-D. (a) of FIG. 14 is a cross-sectional view schematically illustrating a state in which only the light-emitting elements Xr on the columns of the red pixels Pr emit lights in the display device 1 according to the present embodiment, and (b) of FIG. 14 is a plan view schematically illustrating a state in which only the light-emitting elements Xr on the columns of the red pixels Pr emit lights in the display device 1 according to the present embodiment. In other words, (a) and (b) of FIG. 14 schematically illustrate the state in which only the light-emitting layer 33r emits the light. Note that, in (a) and (b) of FIG. 13 and (a) of FIG. 14, for convenience of illustration, ratios of the layer thicknesses of the layers are changed for illustration, and the constituent elements in the thin film transistor layer 4 are omitted. Furthermore, in (a) and (b) of each of FIG. 12 to FIG. 14, for convenience of illustration, the sealing layer 6 and the function film 7 are omitted. In FIG. 12, for convenience of illustration, each of pixels Pr, Pg, and Pb has a rectangular shape, but each of four corners of each of the pixels Pr, Pg, and Pb has not a right angle but a curved shape, so-called round (circular) shape (arc shape) as illustrated in (b) of FIG. 14. Moreover, (a) and (b) of FIG. 13 illustrate a non-light emission state (power off state).

As illustrated in FIG. 12 and (a) and (b) of FIG. 13, in the display device 1 according to the present embodiment, the second electrode 25 has a dual-layer structure in which a common second electrode 25b is layered on an island-shaped second electrode 25a, the common second electrode 25b being common to all the pixels P and covering entirely the active area DA, the island-shaped second electrode 25a being formed into an island shape for each pixel P. The island-shaped second electrode 25a is formed of the mesh metal nanowires NW and is formed into an island shape as part of the second electrode 25 in the opening 23a of the pixel bank 23 in contact with the function layer 24. The common second electrode 25b is a transparent conductive film not including the metal nanowires NW (hereinafter simply referred to as a "transparent conductive film"), and is formed in a solid-like manner common to the plurality of light-emitting elements X to cross the pixel bank 23 as part of the second electrode 25. Examples of a material of the transparent conductive film may include ITO, IZO, and the like. The transparent conductive film can be formed by sputtering and the like, for example.

According to the present embodiment, the same effects as the first embodiment can be obtained, and as illustrated in FIG. 12 and (a) and (b) of FIG. 13, the second electrode 25 has the dual-layer structure of the island-shaped second electrode 25a that is a metal nanowire layer and the common second electrode 25b that is a transparent conductive film as described above, and thereby, the resistance of the second electrode 25 can be reduced and electrical conductivity can be improved.

In addition, according to the present embodiment, the transparent conductive film is formed in a solid-like manner in contact with the metal nanowire layer as described above, and thus, the metal nanowire layer can be formed into an island shape for each pixel P as the island-shaped second electrode 25a. Moreover, as illustrated in (a) and (b) of FIG. 14 in which portions of the function layer 24 and the second electrode 25 are hatched by a dark color indicating a red light, the transparent conductive film little scatters the light emitted from the light-emitting layer 33. Thus, according to the present embodiment, the island-shaped second electrode 25a that is a metal nanowire layer is formed into an island shape in the opening 23a of the pixel bank 23, and thereby, the light scattered by the metal nanowires NW can be prevented from propagating to other pixels P even though the common second electrode 25b formed of a transparent conductive film is formed across the pixel bank 23 in common to the plurality of light-emitting elements X.

Accordingly, the display device 1 according to the present embodiment may have a pixel arrangement other than the stripe arrangement, and the pixel arrangement is not particularly limited. However, in the first embodiment also, in a case that a contact layer (not illustrated) that brings the metal nanowire layers into contact with each other is provided on each pixel P, the metal nanowire layer (i.e., the second electrode 25) can be separated for each pixel P.

It goes without saying that in a case that the second electrode 25 has a dual-layer structure of a metal nanowire layer in a solid-like manner and a transparent conductive film in a solid-like manner, similar results to those illustrated in (a) and (b) of FIG. 10 are obtained. It goes without saying that the electron transport layer 35 may also be provided between the second electrode 25 and the electron injection layer 34 in the present embodiment.

In addition, according to the present embodiment, even if the common second electrode 25b (transparent conductive film) described above is formed by, for example, sputtering, the light-emitting layer 33 is not damaged in sputtering film forming or light-emission characteristics are not degraded because the electron injection layer 34 and the island-shaped second electrode 25a are provided between the light-emitting layer 33 and the common second electrode 25b.

Third Embodiment

In the present embodiment, mainly differences between the present embodiment and the first embodiment will be described, and constituent elements having functions identical to the functions of the constituent elements in the first embodiment are denoted by identical reference signs, with description thereof being omitted.

Figure 15:
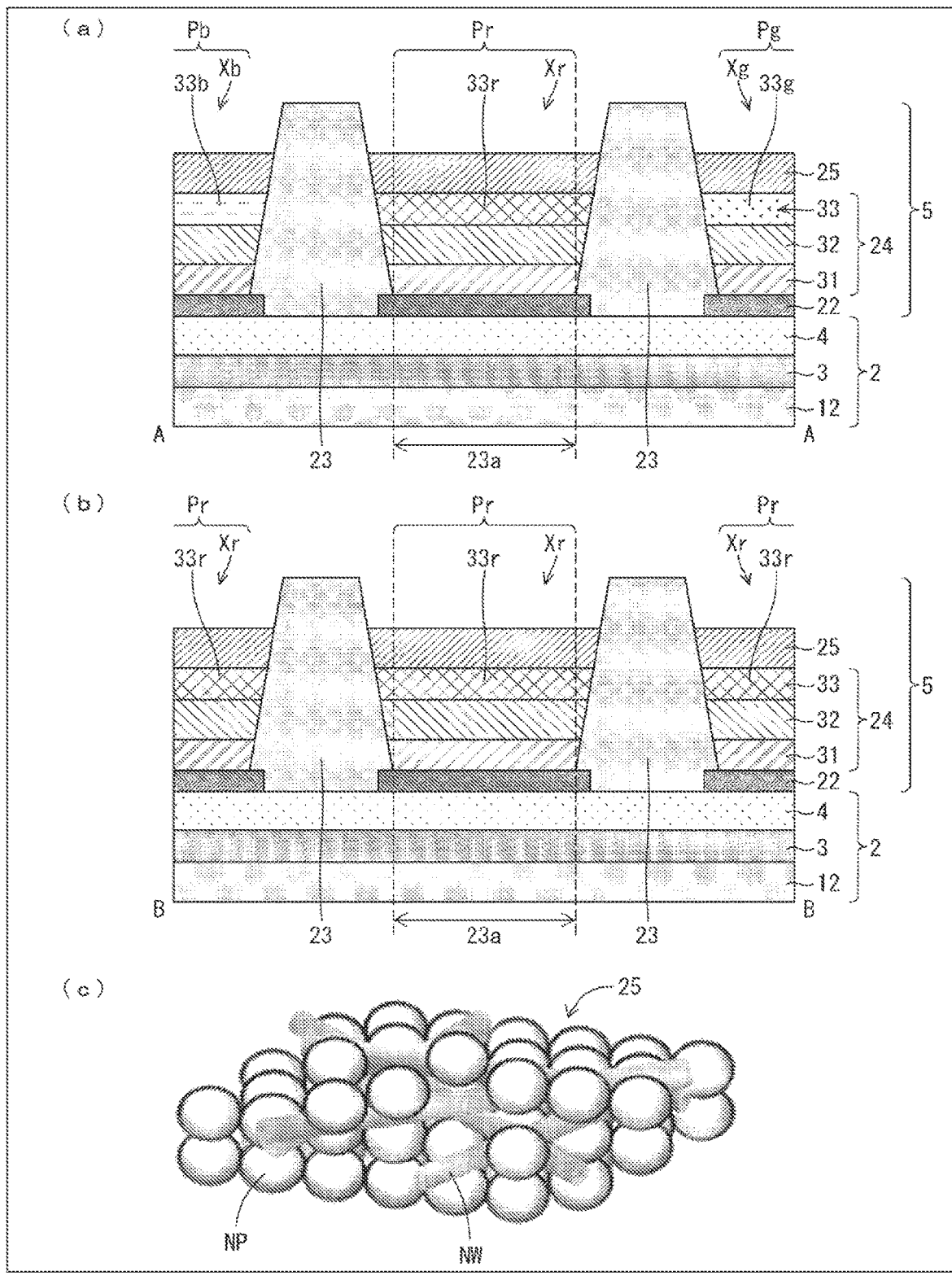
FIGS. 15(a) and 15(b) are cross-sectional views schematically illustrating a schematic configuration of a display device according to a third embodiment.
FIG. 15(c) is a perspective view schematically illustrating a configuration of a second electrode according to the third embodiment.

(a) and (b) of FIG. 15 are cross-sectional views schematically illustrating a schematic configuration of the display device 1 according to the present embodiment, and (c) of FIG. 15 is a perspective view schematically illustrating a configuration of the second electrode 25 according to the present embodiment. Note that a plan view illustrating the schematic configuration of the main portions of the display device 1 according to the present embodiment is the same as FIG. 2. However, in the present embodiment also, each of four corners of each of the pixels Pr, Pg, and Pb has not a right angle but a curved shape, so-called round (circular) shape (arc shape). (a) of FIG. 15 corresponds to the cross-sectional view seen in a direction of arrows taken along a line A-A of the display device 1 illustrated in FIG. 2. (b) of FIG. 15 corresponds to the cross-sectional view seen in a direction of arrows taken along a line B-B of the display device 1 illustrated in FIG. 2. Note that in (a) and (b) of FIG. 15, for convenience of illustration, ratios of the layer thicknesses of the layers are changed for illustration, and the constituent elements in the thin film transistor layer 4 are omitted. Furthermore, in (a) and (b) of FIG. 15, for convenience of illustration, the sealing layer 6 and the function film 7 are omitted. Moreover, (a) and (b) of FIG. 15 illustrate a non-light emission state (power off state).

The second electrode 25 may include the metal nanowires NW and the electron transport material. The second electrode 25 illustrated in (c) of FIG. 15 includes, as an example, the metal nanowires NW and ZnO nanoparticles NP, the ZnO nanoparticles NP being the electron transport material, and has a structure in which the electron injection layer 34 and the second electrode 25 are integrated. Specifically, in the present embodiment, the electron injection layer 34 is provided as an electron injection and transport layer in contact with the light-emitting layer 33 and serves as also the second electrode 25. In other words, it can be said that the second electrode 25 according to the present embodiment is an electron injection layer (electron injection and transport layer), and the electron injection layer includes the metal nanowires NW. It goes without saying that the electron transport layer 35 may also be provided between the second electrode 25 and the light-emitting layer 33.

According to the present embodiment, for example, a metal nanowire dispersed liquid in which the metal nanowires NW are dispersed in a solvent (for example, a silver nanowire dispersed liquid), and a ZnO nanoparticle dispersed liquid in which ZnO nanoparticles NP which are electron transport materials are dispersed in a solvent are mixed at a desired ratio, and the stirred mixture is applied, for example, onto the light-emitting layer 33 and dried (the solvent is removed). The solvents may be, for example, water, ethanol, isopropanol, toluene, hexane, and the like. This results in the second electrode 25 in which the metal nanowires NW and the ZnO nanoparticles NP are mixed.

Specifically, the metal nanowires NW such as silver nanowires are three-dimensionally and randomly arranged so that the metal nanowire NW passes through a gap between the ZnO nanoparticles NP (average particle size from 1 to 30 nm).

Note that the mixture may further contain a binder resin. Accordingly, the second electrode 25 may further include a binder resin. In this case, the binder resin may be dispersed in a solvent together with the ZnO nanoparticles NP and mixed with the metal nanowire dispersed liquid, or may be dispersed in a solvent in advance, and then, mixed with the metal nanowire dispersed liquid and the ZnO nanoparticle dispersed liquid. Examples of the binder resin may include polyvinylpyrrolidone (PVP) and the like.

As illustrated in (a) and (b) of FIG. 15, the light-emitting element X according to the present embodiment has a configuration in which the first electrode 22 (anode electrode), the hole injection layer 31, the hole transport layer 32, the light-emitting layer 33 (for example, the quantum dot light-emitting layer), and the second electrode 25 (cathode electrode) are provided in this order.

Note that in the present embodiment also, as illustrated in FIG. 2, the display device 1 has the stripe arrangement, and in step S4 of forming the second electrode 25 including the metal nanowires NW on the function layer 24, the above mixture is applied onto the light-emitting layer 33 so as to cross, for example, only the pixel banks 23 in the pixel columns having the identical luminescent color (that is, cross the pixel bank 23 between the pixels P having the identical luminescent color but not cross the pixel bank 23 between the pixels P having different luminescent colors) among the pixel banks 23.

Figure 16:
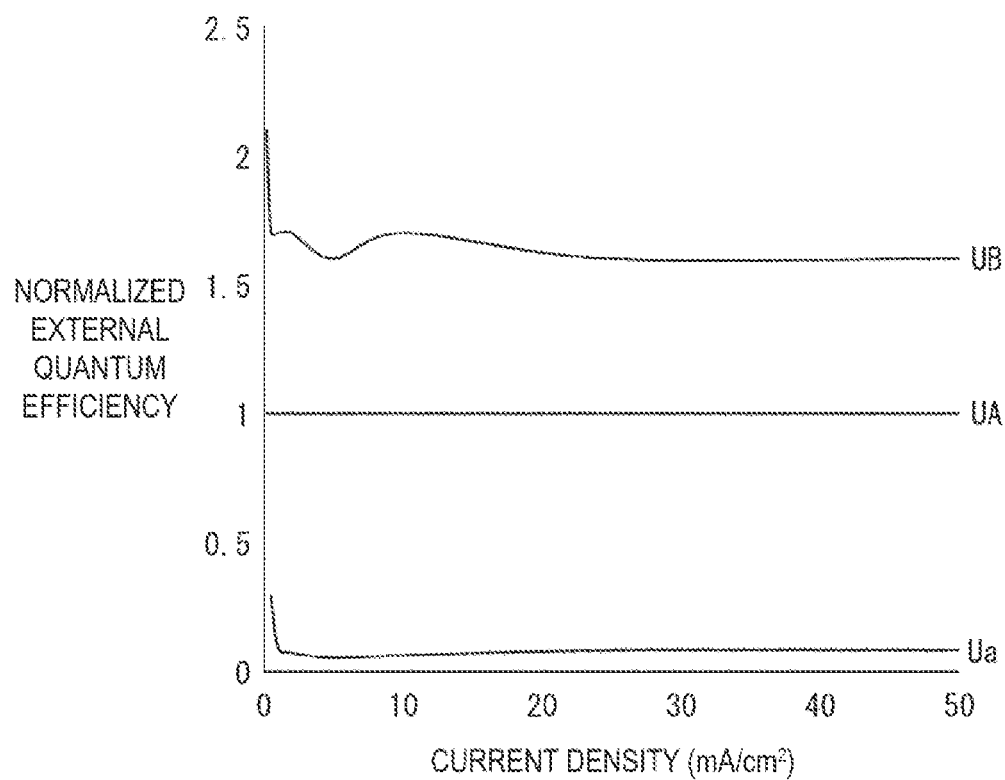
FIG. 16 is a graph illustrating a normalized external quantum efficiency of the light-emitting element according to the first embodiment with a current density in a range from 0 to 50 mA/cm$^2$, and a normalized external quantum efficiency of a light-emitting element according to a third embodiment and a normalized external quantum efficiency of a light-emitting element having a typical silver thin film cathode electrode, the latter two normalized external quantum efficiencies being normalized by the normalized external quantum efficiency of the light-emitting element according to the first embodiment.

FIG. 16 is a graph illustrating a normalized external quantum efficiency UA (where a reference value in each current density is equal to 1) of the light-emitting element X according to the first embodiment (that is the light-emitting element X in which a silver nanowire layer is formed as the second electrode 25 on the ZnO nanoparticle layer as the electron injection layer 34) with a current density in a range from 0 to 50 mA/cm$^2$, and a normalized external quantum efficiency UB (normalized value with respect to the reference value) of the light-emitting element X according to the present embodiment (that is the light-emitting element X in which the second electrode 25 includes the silver nanowires and the ZnO nanoparticles) and a normalized external quantum efficiency Ua (normalized value with respect to the reference value) of a light-emitting element having a typical silver thin film cathode electrode, the normalized external quantum efficiencies UB and Ua being normalized by the external quantum efficiency of the light-emitting element according to the first embodiment.

According to the present embodiment, the second electrode 25 includes the silver nanowires and the ZnO nanoparticles as described above, increasing the contact area between the silver nanowires NW and the ZnO nanoparticles NP which are the electron transport material in the second electrode 25. Thus, as illustrated in FIG. 16, with the current density in a range from 0 to 50 mA/cm$^2$, the normalized external quantum efficiency UB of the light-emitting element X according to the present embodiment is significantly improved compared to the normalized external quantum efficiency UA of the light-emitting element X according to the first embodiment and the normalized external quantum efficiency Ua of the light-emitting element having a typical silver thin film cathode electrode. In addition, according to the present embodiment, the second electrode 25 includes the silver nanowires and the ZnO nanoparticles as described above, thus improving an electron injection efficiency for the light-emitting layer 33.

In addition, according to the present embodiment, the number of processes can be reduced compared to the case that the electron injection layer 34 and the second electrode 25 are formed in separate processes as in the first embodiment.

Figure 17:
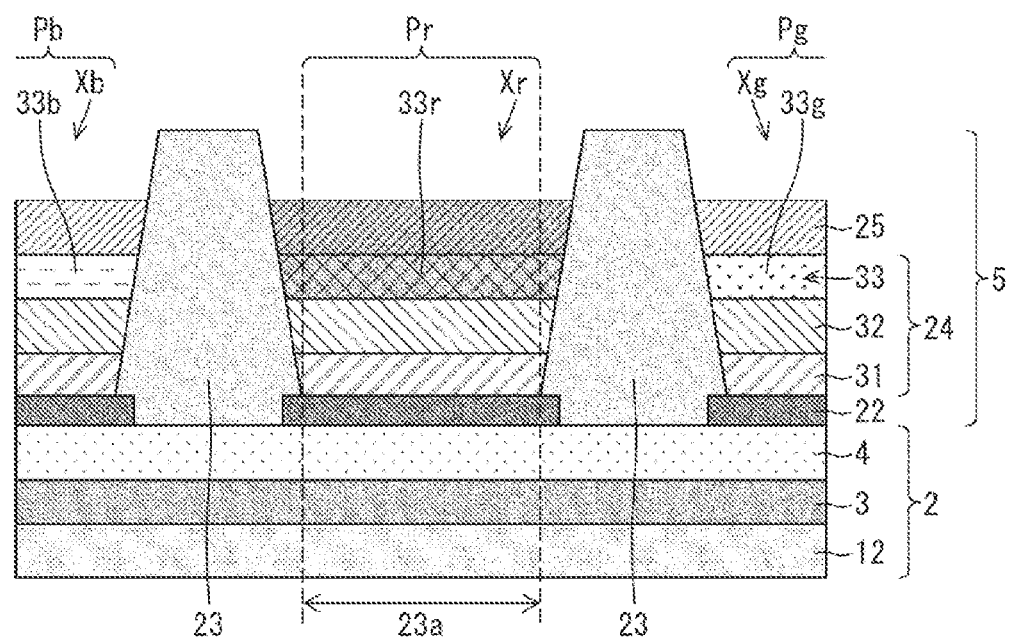
FIG. 17 is a cross-sectional view schematically illustrating a state in which only light-emitting elements on columns of red pixels emit lights in the display device according to the third embodiment.

FIG. 17 is a cross-sectional view schematically illustrating a state in which only light-emitting elements Xr on the columns of the red pixels Pr emit lights in the display device 1 according to the present embodiment. In other words, FIG. 17 schematically illustrates the state in which only the light-emitting layer 33r emits the light. Note that in FIG. 17, for convenience of illustration, ratios of the layer thicknesses of the layers are changed for illustration, and the constituent elements in the thin film transistor layer 4 are omitted. A plan view illustrating a state in which only light-emitting elements Xr on the columns of the red pixels Pr emit lights in the display device 1 according to the present embodiment is the same as (b) of FIG. 8.

As illustrated in FIG. 17 and (b) of FIG. 8, according to the display device 1 of the present embodiment, the second electrode 25 including the metal nanowires NW is partitioned by the pixel bank 23 for each luminescent color (that is, for each of the pixel columns having the identical luminescent color), and thereby, the light scattered by the metal nanowires NW can be prevented from propagating to the pixels P of other luminescent colors (pixels Pg and Pb in the example illustrated in FIG. 17) as illustrated in FIG. 17 and (b) of FIG. 8 in which a portion of the function layer 24 and a portion of the second electrode 25 are hatched by a dark color indicating a red light.

It goes without saying that in a case that the second electrode 25 is formed in a solid-like manner similar to the second electrode 25 in the comparison display device illustrated in (a) and (b) of FIG. 9, similar results to those illustrated in (a) and (b) of FIG. 10 are obtained.

Note that if the metal nanowires NW is too large with respect to the ZnO nanoparticles NP, an electron transport capability to the light-emitting layer 33 declines, and if the metal nanowires NW is too small with respect to the ZnO nanoparticles NP, a resistance value increases. Thus, a volume ratio of the metal nanowires NW to the ZnO nanoparticles NP is preferably from 1/49 to 1/9, and more preferably from 1/25 to 1/15.

Fourth Embodiment

In the present embodiment, mainly differences between the present embodiment and the third embodiment will be described, and constituent elements having functions identical to the functions of the constituent elements in the third embodiment are denoted by identical reference signs, with description thereof being omitted.

Figure 18:
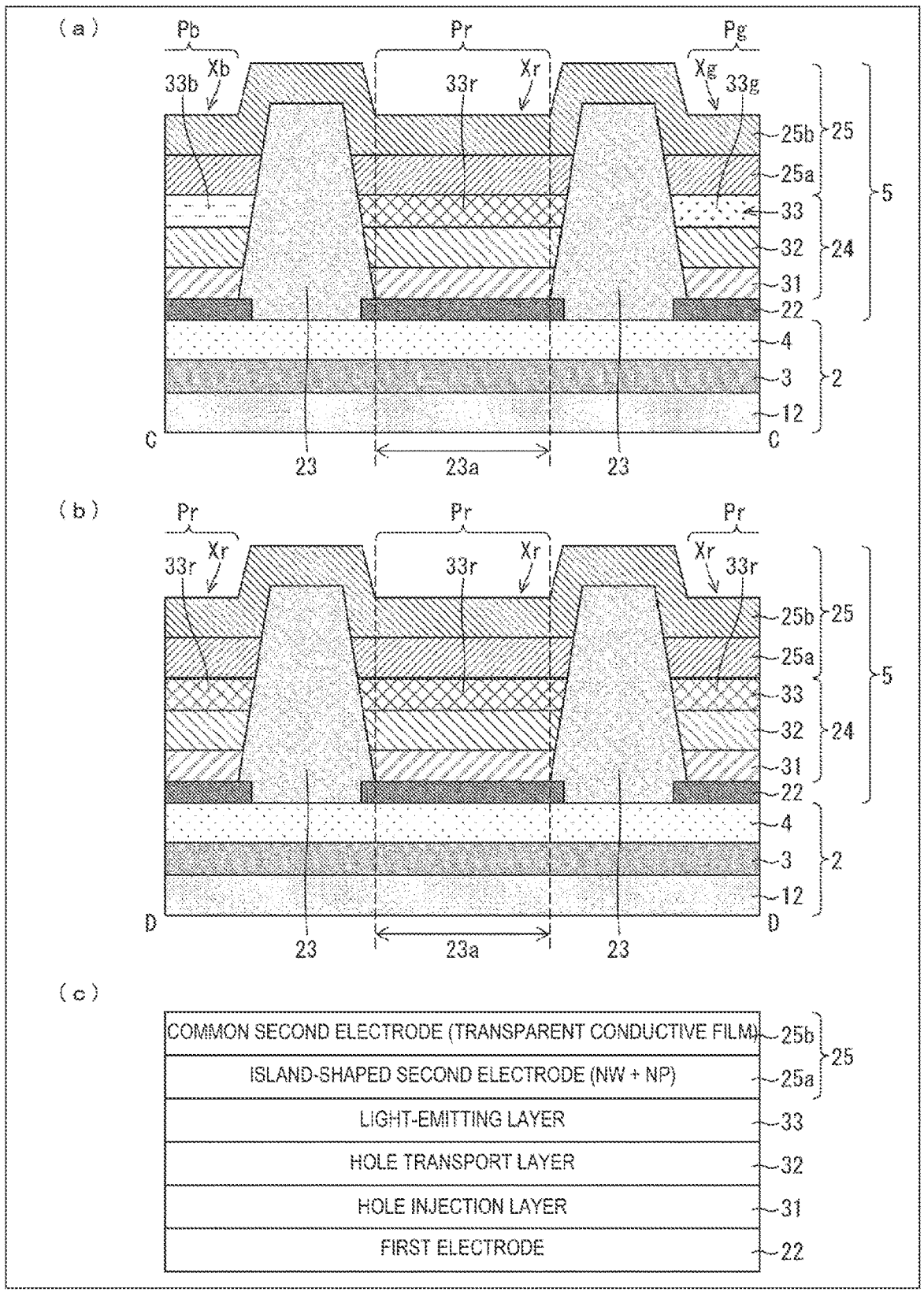
FIGS. 18(a) and 18(b) are cross-sectional views schematically illustrating a schematic configuration of a display device according to a fourth embodiment.
FIG. 18(c) is a cross-sectional view schematically illustrating a configuration of a light-emitting element according to the fourth embodiment.
Figure 19:
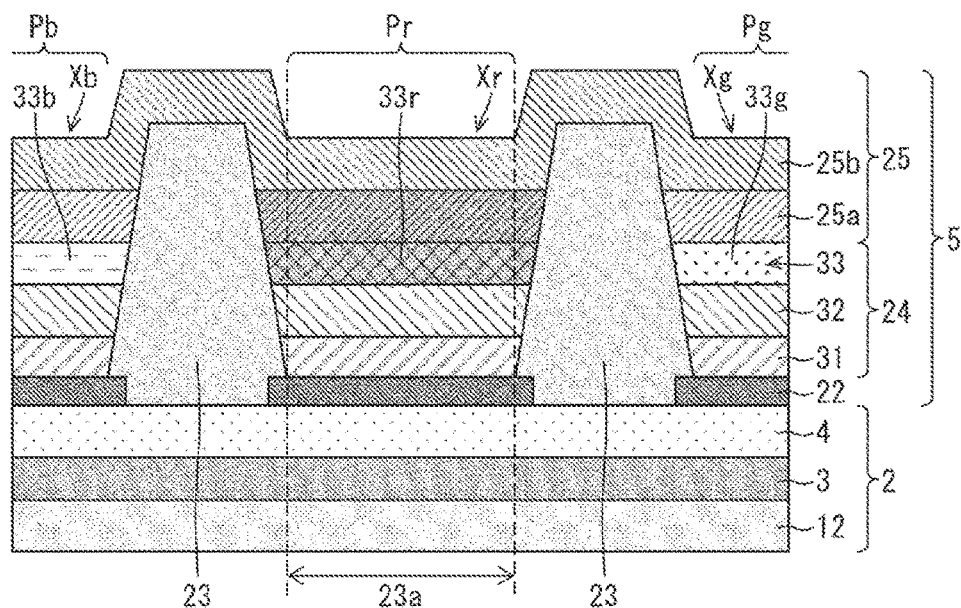
FIG. 19 is a cross-sectional view schematically illustrating a state in which only light-emitting elements on columns of red pixels emit lights in the display device according to the fourth embodiment.

(a) and (b) of FIG. 18 are cross-sectional views schematically illustrating a schematic configuration of the display device 1 according to the present embodiment, and (c) of FIG. 18 is a cross-sectional view schematically illustrating a configuration of the light-emitting element X according to the present embodiment. Note that a plan view illustrating the schematic configuration of the main portions of the display device 1 according to the present embodiment is the same as FIG. 12. However, in the present embodiment also, each of four corners of each of the pixels Pr, Pg, and Pb has not a right angle but a curved shape, so-called round (circular) shape (arc shape). (a) of FIG. 18 corresponds to the cross-sectional view seen in a direction of arrows taken along a line C-C of the display device 1 illustrated in FIG. 12. (b) of FIG. 18 corresponds to the cross-sectional view seen in a direction of arrows taken along a line D-D of the display device 1 illustrated in FIG. 12. (a) and (b) of FIG. 18 illustrate a non-light emission state (power off state). FIG. 19 is a cross-sectional view schematically illustrating a state in which only light-emitting elements Xr on the columns of the red pixels Pr emit lights in the display device 1 according to the present embodiment. In other words, FIG. 19 schematically illustrates the state in which only the light-emitting layer 33r emits the light. Note that a plan view illustrating a state in which only light-emitting elements Xr on the columns of the red pixels Pr emit lights in the display device 1 according to the present embodiment is the same as (b) of FIG. 14. Note that, in (a) and (b) of FIG. 18 and FIG. 19, for convenience of illustration, ratios of the layer thicknesses of the layers are changed for illustration, the constituent elements in the thin film transistor layer 4 are omitted, and the sealing layer 6 and the function film 7 are omitted.

As illustrated in (a) to (c) of FIG. 18, in the display device 1 according to the present embodiment, the second electrode 25 has the dual-layer structure in which the common second electrode 25b is layered on the island-shaped second electrode 25a, the common second electrode 25b being common to all the pixels P and covering entirely the active area DA, the island-shaped second electrode 25a being formed into an island shape for each pixel P. The island-shaped second electrode 25a includes the metal nanowires NW and the electron transport material as the second electrode 25 according to the third embodiment. Note that the island-shaped second electrode 25a according to the present embodiment may also further include a binder resin, as the second electrode 25 according to the third embodiment.

The island-shaped second electrode 25a illustrated in (c) of FIG. 18 includes, as an example, the metal nanowires NW and the ZnO nanoparticles NP which are the electron transport material, and has a structure in which the electron injection layer 34 and the second electrode 25 are integrated. Specifically, in the present embodiment, the electron injection layer 34 is provided as an electron injection and transport layer in contact with the light-emitting layer 33 and serves as also part of the second electrode 25. In other words, it can be said that the island-shaped second electrode 25a according to the present embodiment is an electron injection layer (electron injection and transport layer), and the electron injection layer includes the metal nanowires NW.

The island-shaped second electrode 25a is formed into an island shape as part of the second electrode 25 in the opening 23a of the pixel bank 23 in contact with the function layer 24. The common second electrode 25b is a transparent conductive film not including the metal nanowires NW (hereinafter simply referred to as a "transparent conductive film"), and is formed in a solid-like manner common to the plurality of light-emitting elements X to cross the pixel bank 23 as part of the second electrode 25. Examples of a material of the transparent conductive film may include ITO, IZO, and the like. The transparent conductive film can be formed by sputtering and the like, for example.

According to the present embodiment, the same effects as the third embodiment can be obtained, and as illustrated in (a) to (c) of FIG. 18, the second electrode 25 has the dual-layer structure of the island-shaped second electrode 25a that is an electrode layer including the metal nanowires NW and the common second electrode 25b that is a transparent conductive film as described above, and thereby, the resistance of the second electrode 25 can be reduced and the electrical conductivity can be improved.

In addition, according to the present embodiment, the transparent conductive film is formed in a solid-like manner in contact with the electrode layer including the metal nanowires NW as described above, and thus, the electrode layer including the metal nanowires NW can be formed into an island shape for each pixel P as the island-shaped second electrode 25a. Moreover, as illustrated in FIG. 19 and (b) of FIG. 14 in which a portion of the function layer 24 and a portion of the second electrode 25 are hatched by a dark color indicating a red light, the transparent conductive film little scatters the light emitted from the light-emitting layer 33. Thus, according to the present embodiment, the island-shaped second electrode 25a including the metal nanowires NW is formed into an island shape in the opening 23a of the pixel bank 23, and thereby, the light scattered by the metal nanowires NW can be prevented from propagating to other pixels P even though the common second electrode 25b formed of a transparent conductive film is formed across the pixel bank 23 in common to the plurality of light-emitting elements X.

Accordingly, the display device 1 according to the present embodiment may have a pixel arrangement other than the stripe arrangement, and the pixel arrangement is not particularly limited. However, in the third embodiment also, in a case that a contact layer (not illustrated) that brings the layers including the metal nanowires into contact with each other is provided on each pixel P, the layers including the metal nanowires (i.e., the second electrode 25) can be separated for each pixel P.

It goes without saying that in a case that the second electrode 25 has a dual-layer structure of an electrode layer including the metal nanowires NW in a solid-like manner and a transparent conductive film in a solid-like manner, similar results to those illustrated in (a) and (b) of FIG. 10 are obtained. It goes without saying that the electron transport layer 35 may also be provided between the second electrode 25 and the light-emitting layer 33 in the present embodiment.

In addition, according to the present embodiment, even if the common second electrode 25b (transparent conductive film) described above is formed by, for example, sputtering, the light-emitting layer 33 is not damaged in sputtering film forming or the light-emission characteristics are not degraded because the island-shaped second electrode 25a is provided between the light-emitting layer 33 and the common second electrode 25b.

Fifth Embodiment

In the present embodiment, mainly differences between the present embodiment and the third embodiment will be described, and constituent elements having functions identical to the functions of the constituent elements in the third embodiment are denoted by identical reference signs, with description thereof being omitted.

Figure 20:
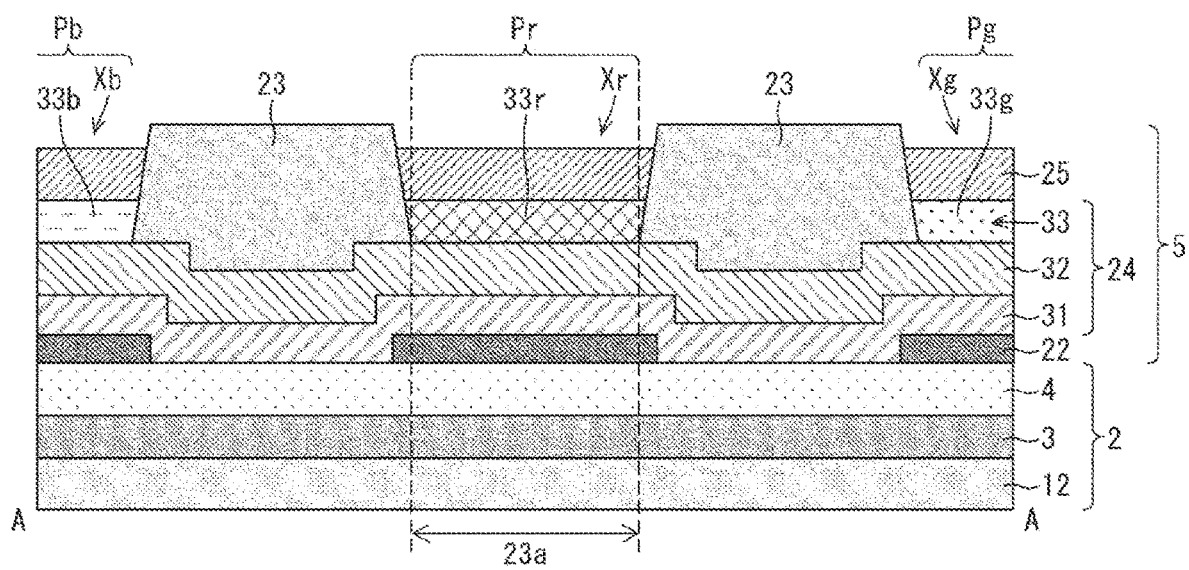
FIG. 20 is a cross-sectional view schematically illustrating a schematic configuration of a display device according to a fifth embodiment.

FIG. 20 is a cross-sectional view schematically illustrating a schematic configuration of the display device 1 according to the present embodiment. Note that a plan view illustrating the schematic configuration of the main portions of the display device 1 according to the present embodiment is the same as FIG. 2. However, in the present embodiment also, each of four corners of each of the pixels Pr, Pg, and Pb has not a right angle but a curved shape, so-called round (circular) shape (arc shape). FIG. 20 corresponds to the cross-sectional view seen in a direction of arrows taken along a line A-A of the display device 1 illustrated in FIG. 2. Note that, in FIG. 20, for convenience of illustration, ratios of the layer thicknesses of the layers are changed for illustration, the constituent elements in the thin film transistor layer 4 are omitted, and the sealing layer 6 and the function film 7 are omitted.

The display device 1 illustrated in FIG. 20 has a configuration in which the hole injection layer 31 and the hole transport layer 32 are provided in this order from the first electrode 22 side between the first electrode 22 and the pixel bank 23. In the present embodiment, the pixel bank 23 is formed on the hole transport layer 32 to cover a periphery (edge) of the first electrode 22 in each of the pixels P (in other words, each of the light-emitting elements X) in a plan view (i.e., the opening 23a of the pixel bank 23 is positioned more inner side than the edge of the first electrode 22 in a plan view), and to expose the hole transport layer 32 in each pixel P. Note that both the hole injection layer 31 and the hole transport layer 32 may be common layers common to all the pixels P and covering entirely the active area DA. Accordingly, both the hole injection layer 31 and the hole transport layer 32 may be provided in common to all the light-emitting elements X so as to respectively cover an upper face and a side surface of the first electrode 22 in each of all the light-emitting elements X in a plan view.

However, the present embodiment is not limited thereto, and at least one of the hole injection layer 31 and the hole transport layer 32 may be patterned for each pixel P (in other words, for each light-emitting element X). Thus, the pixel bank 23 may cover the periphery (edge) of the hole transport layer 32 in each pixel P (in other words, each light-emitting element X) to expose the hole transport layer 32, and may cover the periphery (edge) of the hole injection layer 31 in each pixel P in a plan view. In this case, the hole injection layer 31 and the hole transport layer 32 can be formed into island shapes corresponding to each pixel P by patterning, for example, using photolithography method after the film formation.

In addition, the hole transport layer 32 may be provided in common to at least some of the light-emitting elements X (in other words, the plurality of light-emitting elements X having the identical luminescent color and adjacent to each other) among the light-emitting elements X provided on the active area DA so as to cover at least the upper face and the side surface of the pixel bank 23 in the pixel column having the identical luminescent color in a plan view.

In any case, as described above, according to the present embodiment, the pixel bank 23 is formed on the hole transport layer 32 to cover the periphery (edge) of the first electrode 22 in each pixel P in a plan view and expose the hole transport layer 32 in each pixel P. Thus, in any case, the opening 23a of the pixel bank 23 (in other words, the exposed portion of the hole transport layer 32 by the pixel bank 23, and the exposed portion of the first electrode 22 in a plan view) is the light-emitting region of each pixel P.

In any case, according to the present embodiment, the light-emitting layer 33 and the second electrode 25 can be formed into island shapes similar to the third embodiment, and an effect similar to the third embodiment can be obtained.

Note that, as described above, in the present embodiment, in the third embodiment, the example has been described in which the pixel bank 23 is formed to cover the periphery (edge) of the first electrode 22 in each pixel P in a plan view and expose the hole transport layer 32 in each pixel P. However, it goes without saying that in the display device 1 according to any one of the first, second, and fourth embodiments, the pixel bank 23 may be formed to cover the periphery (edge) of the first electrode 22 in each pixel P in a plan view and expose the hole transport layer 32 in each pixel P.

Sixth Embodiment

In the present embodiment, mainly differences between the present embodiment and the third embodiment will be described, and constituent elements having functions identical to the functions of the constituent elements in the third embodiment are denoted by identical reference signs, with description thereof being omitted.

Figure 21:
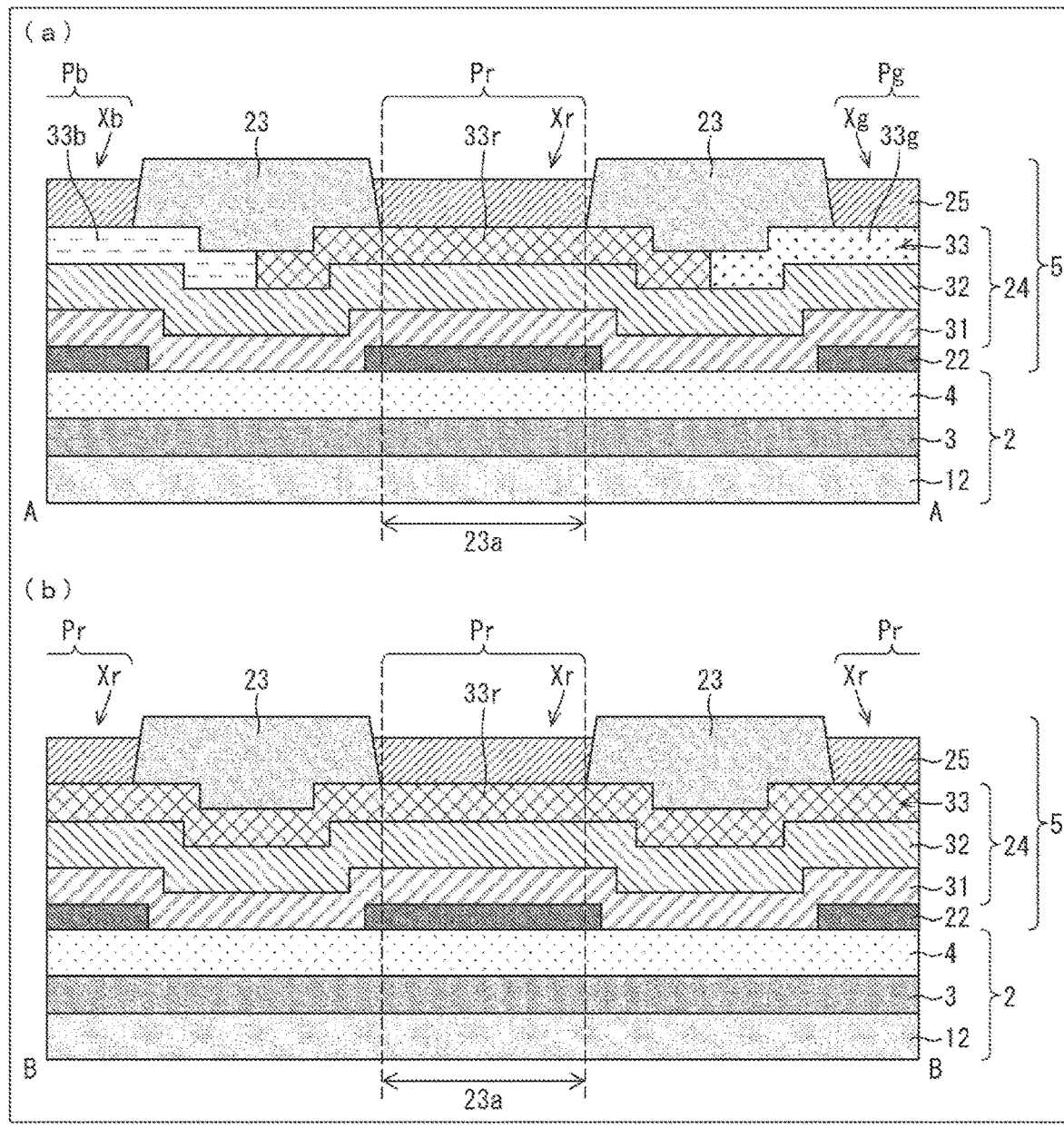
FIG. 21(a) is a cross-sectional view schematically illustrating a schematic configuration of a display device according to a sixth embodiment.
FIG. 21(b) is another cross-sectional view schematically illustrating the schematic configuration of the display device according the sixth embodiment.

(a) of FIG. 21 is a cross-sectional view schematically illustrating a schematic configuration of the display device 1 according to the present embodiment, and (b) of FIG. 21 is another cross-sectional view schematically illustrating the schematic configuration of the display device 1 according to the present embodiment. Note that a plan view illustrating the schematic configuration of the main portions of the display device 1 according to the present embodiment is the same as FIG. 2. However, in the present embodiment also, each of four corners of each of the pixels Pr, Pg, and Pb has not a right angle but a curved shape, so-called round (circular) shape (arc shape). (a) of FIG. 21 corresponds to the cross-sectional view seen in a direction of arrows taken along a line A-A of the display device 1 illustrated in FIG. 2. (b) of FIG. 21 corresponds to the cross-sectional view seen in a direction of arrows taken along a line B-B of the display device 1 illustrated in FIG. 2. Note that, in (a) and (b) of FIG. 21, for convenience of illustration, ratios of the layer thicknesses of the layers are changed for illustration, the constituent elements in the thin film transistor layer 4 are omitted, and the sealing layer 6 and the function film 7 are omitted.

As illustrated in (a) and (b) of FIG. 21, in the present embodiment, the pixel bank 23 is formed on the light-emitting layer 33 to cover a periphery (edge) of the first electrode 22 in each of the pixels P (in other words, each of the light-emitting elements X) in a plan view (i.e., the opening 23a of the pixel bank 23 is positioned more inner side than the edge of the first electrode 22 in a plan view), and to expose the light-emitting layer 33 in each pixel P. Note that in any case, the opening 23a of the pixel bank 23 (in other words, the exposed portion of the light-emitting layer 33 by the pixel bank 23, and the exposed portion of the first electrode 22 in a plan view) is the light-emitting region of each pixel P.

In the example illustrated in (a) and (b) of FIG. 21, the light-emitting layer 33 is formed into an island shape across a plurality of pixels P on the same pixel column so that the display device 1 has the stripe arrangement in which the pixels P having the same display color are arranged in a stripe. Thus, the light-emitting layer 33 is provided in common to some pixels P of the plurality of pixels P (in other words, some light-emitting elements X of the plurality of light-emitting elements X) in a plan view to cover, for example, the upper faces and the side surfaces of the plurality of adjacent first electrodes 22 in the same pixel column. Note that the pixels P in common to which the light-emitting layer 33 is provided have the identical luminescent color. Accordingly, in the example described above, it can be interpreted that the light-emitting layer 33 covers the upper faces and the side surfaces of the first electrodes 22 of the adjacent light-emitting elements X in the pixel column having the identical luminescent color in a plan view.

As described above, (a) and (b) of FIG. 21 illustrate the example of the case that the light-emitting layer 33 is patterned in an island shape in common to some pixels P of the plurality of pixels P. However, as illustrated in (a) and (b) of FIG. 3, (a) and (b) of FIG. 13 or the like, the light-emitting layer 33 may be patterned in an island shape for each pixel P with respect to all the pixels P in the active area DA.

(a) and (b) of FIG. 21 illustrate the example of the case that both the hole injection layer 31 and the hole transport layer 32 are the common layers common to all the pixels P and covering entirely the active area DA. However, at least one of the hole injection layer 31 and the hole transport layer 32 may be patterned in an island shape for each pixel column having the identical luminescent color or for each pixel P, or may be patterned to have the same pattern as the light-emitting layer 33, for example.

The light-emitting layer 33 is patterned to have a desired island-shape pattern by patterning, for example, using photolithography method after the film formation. Similarly, the hole injection layer 31 or the hole transport layer 32 may also be patterned to have a desired island-like pattern by patterning, for example, using photolithography method after the film formation.

In any case, according to the present embodiment, the second electrode 25 can be formed into an island shape similar to the third embodiment, and an effect similar to the third embodiment can be obtained. In this way, the pixel bank 23 may be provided on the light-emitting layer 33 to segment only the second electrode 25 (more strictly, only the layer containing the metal nanowires NW) by the pixel bank 23.

Note that in the present embodiment, in the third embodiment, the example has been described in which the pixel bank 23 is formed to cover the periphery (edge) of the first electrode 22 in each pixel P in a plan view and expose the light-emitting layer 33 in each pixel P. However, it goes without saying that in the display device 1 according to any one of the first, second, and fourth embodiments, the pixel bank 23 may be formed to cover the periphery (edge) of the first electrode 22 in each pixel Pin a plan view and expose the light-emitting layer 33 in each pixel P.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device provided with a plurality of pixels, the display device comprising:
   a thin film transistor layer; and
   a light-emitting element layer including a plurality of light-emitting elements on the thin film transistor layer, the plurality of light-emitting elements configured to emit lights of luminescent colors different from each other, each of the plurality of light-emitting elements being provided with a first electrode, a function layer including a light-emitting layer, and a second electrode in this order from a side of the thin film transistor layer,
   wherein the second electrode includes metal nanowires,
   the light-emitting element layer is provided with a bank segmenting the metal nanowires at least for each of the luminescent colors, and
   the second electrode is in contact with a conductive film at an area that is not an upper part of the bank.

2. The display device according to claim 1,
wherein the first electrode is an anode electrode,
the second electrode is a cathode electrode, and
an electron injection layer is provided between the second electrode and the light-emitting layer.

3. The display device according to claim 2,
wherein an electron transport layer is provided between the second electrode and the electron injection layer.

4. A display device provided with a plurality of pixels, the display device comprising:
a thin film transistor layer; and
a light-emitting element layer including a plurality of light-emitting elements on the thin film transistor layer, the plurality of light-emitting elements configured to emit lights of luminescent colors different from each other, each of the plurality of light-emitting elements being provided with a first electrode, a function layer including a light-emitting layer, and a second electrode in this order from a side of the thin film transistor layer,
wherein the second electrode includes metal nanowires,
the light-emitting element layer is provided with a bank segmenting the metal nanowires at least for each of the luminescent colors,
the first electrode is an anode electrode, and
the second electrode includes an electron transport material and serves as an electron injection layer-cathode electrode.

5. The display device according to claim 4,
wherein the second electrode is provided in contact with the light-emitting layer.

6. The display device according to claim 4,
wherein an electron transport layer is provided between the second electrode and the light-emitting layer.

7. The display device according to claim 1,
wherein the bank segments the metal nanowires for each of the plurality of pixels, and
the second electrode is provided with
an island-shaped second electrode including the metal nanowires and segmented for each of the plurality of pixels by the bank, and
a common second electrode, formed of a transparent conductive film, not including metal nanowires, the common second electrode being provided on the island-shaped second electrode to cross the bank in common to the plurality of light-emitting elements.

8. The display device according to claim 7,
wherein the first electrode is an anode electrode,
the second electrode is a cathode electrode, and
an electron injection layer is provided between the second electrode and the light-emitting layer.

9. The display device according to claim 8,
wherein an electron transport layer is provided between the second electrode and the electron injection layer.

10. The display device according to claim 7,
wherein the first electrode is an anode electrode, and
the island-shaped second electrode further includes an electron transport material and serves as an electron injection layer.

11. The display device according to claim 10,
wherein an electron transport layer is provided between the second electrode and the light-emitting layer.

12. The display device according to claim 4,
wherein the electron transport material comprises zinc oxide nanoparticles.

13. The display device according to claim 1,
wherein the bank is formed to cover a periphery of the first electrode in each of the plurality of light-emitting elements and expose the first electrode.

14. The display device according to claim 1,
wherein a hole transport layer is provided between the first electrode and the bank, and
the bank is formed to cover a periphery of the first electrode in each of the plurality of light-emitting elements in a plan view and expose the hole transport layer in each of the plurality of light-emitting elements.

15. The display device according to claim 14,
wherein the hole transport layer is provided in common to a set of light-emitting elements of the plurality of light-emitting elements to cover at least an upper face and a side surface of the first electrode of each of the set of light-emitting elements, among the plurality of light-emitting elements, wherein the light-emitting elements of the set of light-emitting elements have an identical luminescent color and are adjacent to each other in the plan view.

16. A display device provided with a plurality of pixels, the display device comprising:
a thin film transistor layer; and
a light-emitting element layer including a plurality of light-emitting elements on the thin film transistor layer, the plurality of light-emitting elements configured to emit lights of luminescent colors different from each other, each of the plurality of light-emitting elements being provided with a first electrode, a function layer including a light-emitting layer, and a second electrode in this order from a side of the thin film transistor layer,
wherein the second electrode includes metal nanowires,
the light-emitting element layer is provided with a bank segmenting the metal nanowires at least for each of the luminescent colors,
the bank is provided on the light-emitting layer, and
the bank is formed to cover a periphery of the first electrode in each of the plurality of light-emitting elements in a plan view and expose the light-emitting layer in each of the plurality of light-emitting elements.

17. The display device according to claim 16,
wherein the light-emitting layer is provided in common to a set of light-emitting elements, among the plurality of light-emitting elements, having an identical luminescent color to cover upper faces and side surfaces of the plurality of first electrodes in the plan view.

18. The display device according to claim 1,
wherein the light-emitting layer is a quantum dot light-emitting layer.

19. The display device according to claim 1,
wherein the conductive film is in the same layer as the first electrode.

* * * * *